United States Patent
Jacobson et al.

(10) Patent No.: US 9,030,054 B2
(45) Date of Patent: May 12, 2015

(54) ADAPTIVE GATE DRIVE CONTROL METHOD AND CIRCUIT FOR COMPOSITE POWER SWITCH

(75) Inventors: Boris S. Jacobson, Westford, MA (US); Edward Jung, Marlborough, MA (US)

(73) Assignee: Raytheon Company, Waltham, MA (US)

( * ) Notice: Subject to any disclaimer, the term of this patent is extended or adjusted under 35 U.S.C. 154(b) by 671 days.

(21) Appl. No.: 13/431,329

(22) Filed: Mar. 27, 2012

(65) Prior Publication Data

US 2013/0257177 A1  Oct. 3, 2013

(51) Int. Cl.
*H03K 17/56* (2006.01)
*H02M 1/08* (2006.01)
(Continued)

(52) U.S. Cl.
CPC ............. *H02M 1/08* (2013.01); *H03K 17/0406* (2013.01); *H03K 17/04123* (2013.01);
(Continued)

(58) Field of Classification Search
CPC .................... H03K 17/0406; H03K 17/04123; H03K 17/122; H03K 17/127; H03K 17/14
USPC .......................................................... 307/115
See application file for complete search history.

(56) References Cited

U.S. PATENT DOCUMENTS 4,787,007 A  11/1988 Matsumura et al.
5,187,632 A  2/1993 Blessing
(Continued)

FOREIGN PATENT DOCUMENTS

AU      2006232963      3/2010
CN  ZL 200680010862.6  12/2011
(Continued)

OTHER PUBLICATIONS

Notification of Transmittal of the International Search Report and the Written Opinion of the International Searching Authority, or the Declaration, PCT/US2006/010114, date of mailing Jan. 25, 2007, 7 pages.

(Continued)

*Primary Examiner* — Jared Fureman
*Assistant Examiner* — Joel Barnett
(74) *Attorney, Agent, or Firm* — Daly, Crowley, Mofford & Durkee, LLP

(57) ABSTRACT

Provided is a method of controlling a hybrid switch comprising a first individually controllable semiconductor switch operably coupled in parallel to a second individually controllable semiconductor switch. The first semiconductor switch has a faster switching speed and lower power-processing capability than the second semiconductor switch. A first reference value $V_{1REF}$ for a first default turn-on transition time interval $\Delta T_1$ and a second reference value $V_{2REF}$ for a second default turn-off transition time interval $\Delta T_2$ are accessed for the controllable hybrid switch, which is enabled and controlled so that it operates in accordance with $V_{1REF}$ and $V_{2REF}$. The duration of the default $\Delta T_1$ and $\Delta T_2$ used to control operation of the controllable hybrid switch is dynamically adjusted to compensate for at least one of variations in a current to a load operably coupled to the controllable hybrid switch and environmental conditions at the controllable hybrid switch.

20 Claims, 14 Drawing Sheets

(51) Int. Cl.

| | |
|---|---|
| *H03K 17/04* | (2006.01) |
| *H03K 17/0412* | (2006.01) |
| *H03K 17/12* | (2006.01) |
| *H03K 17/14* | (2006.01) |
| *H03K 17/567* | (2006.01) |
| *H02M 3/335* | (2006.01) |

(52) U.S. Cl.
CPC ........... *H03K 17/122* (2013.01); *H03K 17/127* (2013.01); *H03K 17/14* (2013.01); *H03K 17/567* (2013.01); *H02M 3/33584* (2013.01)

(56) References Cited

U.S. PATENT DOCUMENTS

| | | | |
|---|---|---|---|
| 5,397,978 A | 3/1995 | Parry et al. | |
| 5,444,590 A | 8/1995 | LeComte et al. | |
| 5,497,072 A | 3/1996 | LeComte et al. | |
| 5,567,993 A | 10/1996 | Jones et al. | |
| 5,684,663 A | 11/1997 | Mitter | |
| 5,687,049 A | 11/1997 | Mangtani | |
| 5,723,915 A | 3/1998 | Maher et al. | |
| 5,898,557 A | 4/1999 | Baba et al. | |
| 5,932,938 A | 8/1999 | Shimamori | |
| 5,946,181 A | 8/1999 | Gibson | |
| 6,052,268 A | 4/2000 | Thomas | |
| 6,125,024 A | 9/2000 | LeComte et al. | |
| 6,151,681 A | 11/2000 | Roden et al. | |
| 6,300,146 B1 | 10/2001 | Thierry | |
| 6,366,153 B1 | 4/2002 | Arslain et al. | |
| 6,424,552 B1 | 7/2002 | Jacobson et al. | |
| 6,856,283 B2 | 2/2005 | Jacobson et al. | |
| 6,873,138 B2 | 3/2005 | Jacobson | |
| 7,825,536 B2 | 11/2010 | Jacobson et al. | |
| 7,839,023 B2 | 11/2010 | Jacobson et al. | |
| 7,839,201 B2 * | 11/2010 | Jacobson | 327/513 |
| 7,986,535 B2 | 7/2011 | Jacobson et al. | |
| 8,072,093 B2 | 12/2011 | Jacobson et al. | |
| 8,076,967 B2 * | 12/2011 | Jacobson | 327/513 |
| 8,138,818 B2 * | 3/2012 | Tsunoda et al. | 327/374 |
| 8,227,939 B2 | 7/2012 | Jacobson et al. | |
| 2001/0039190 A1 | 11/2001 | Bhatnagar | |
| 2003/0067955 A1 | 4/2003 | Butchers et al. | |
| 2003/0076233 A1 | 4/2003 | Sato et al. | |
| 2003/0214770 A1 | 11/2003 | Schimanek et al. | |
| 2004/0104468 A1 | 6/2004 | Suzuki et al. | |
| 2005/0045879 A1 | 3/2005 | Ausserlechner | |
| 2005/0071090 A1 | 3/2005 | Katou | |

FOREIGN PATENT DOCUMENTS

| | | |
|---|---|---|
| CN | 392230 | 4/2013 |
| DE | 3832273 A1 | 3/1990 |
| EP | 0399754 A2 | 11/1990 |
| EP | 0479362 A | 4/1992 |
| EP | 1357461 A | 10/2003 |
| GB | 2315172 A | 1/1998 |
| GB | 2337121 A | 11/1999 |
| IL | 184796 | 12/2011 |
| KR | 10-1236455 | 2/2013 |
| KR | 10-1262919 | 5/2013 |
| WO | WO 02/088852 A2 | 11/2002 |
| WO | WO 2005/022747 A | 3/2005 |
| WO | WO 2006/107579 A3 | 10/2006 |

OTHER PUBLICATIONS

Written Opinion of the International Search Authority, PCT/US2006/010114, date of mailing Jan. 25, 2007, 18 pages.

Notification Concerning Transmittal of International Preliminary Report on Patentability (Chapter 1 of the Patent Cooperation Treaty), PCT/US2006/010114, date of mailing Oct. 11, 2007, 19 pages.

Extended European Search Report, EP Application No. 10011543.5 dated Dec. 6, 2010, 8 pages.

Siliconix MOSPOWER Applications Handbook, 1984, Siliconix Inc., 4.2 HP-41CV Power MOSFET Thermal Analysis Program, pp. 4-17 to 4-21.

Taiwan Patent Application No.: 095110714 Office Action, English translation, 12 pages.

Taiwan Patent Application No. 095110714, Response to Office Action filed on Nov. 15, 2012, English translation of Claims and partial translation of Specification and related Figures, 33 pages.

Taiwan IPO Search Report for Patent Application No. 095110714, including English translation, 14 pages.

Australian Patent Application No. 2006232963, Office Action dated Sep. 2, 2008, 2 pages.

Australian Patent Application No. 2006232963, Response to Office Action filed on Sep. 30, 2009, 48 pages.

Australian Patent Application No. 2006232963 Deed of Letters Patent dated Mar. 18, 2010, 2 pages.

Israel Patent Application No. 184796, Office Action dated Oct. 11, 2010, including partial English translation, 10 pages.

Israel Patent Application No. 184796, Response to Office Action filed on Mar. 3, 2011 partial English translation only, 18 pages.

Israel Patent Application No. 184796, Certificate of Patent dated Dec. 28, 2011, 2 pages.

EP Patent Application No. 06739053.4 Office Action dated May 27, 2008, 3 pages.

EP Patent Application No. 06739053.4 Response Office Action filed on Dec. 8, 2008, 37 pages.

EP Patent Application No. 06739053.4 Office Action dated Dec. 8, 2010, 4 pages.

EP Patent Application No. 06739053.4 Response Office Action filed on Jun. 8, 2011, 28 pages.

Canadian Patent Application No. 2,598,485 Office Action dated Oct. 1, 2012, 2 pages.

Canadian Patent Application No. 2,598,485 Response to Office Action filed on Mar. 27, 2013, 10 pages.

Canadian Patent Application No. 2,598,485 Office Action dated Feb. 10, 2014, 4 pages.

Japanese Patent Application No. 2008-504143 Office Action dated Jun. 30, 2011, including Foreign Associate cover letter with English translation, 61 pages.

Japanese Patent Application No. 2008-504143 Response to Office Action filed Dec. 5, 2011, including Foreign Associate cover letter with English translation, 28 pages.

Japanese Patent Application No. 2008-504143 Office Action dated Sep. 12, 2012, including Foreign Associate cover letter with English translation, 6 pages.

Japanese Patent Application No. 2008-504143 Response to Office Action filed on Mar. 12, 2013, including Foreign Associate cover letter with English translation, 26 pages.

Japanese Patent Application No. 2008-504143 Office Action dated Jan. 6, 2014, including Foreign Associate cover letter with English translation, 6 pages.

Chinese Patent Application No. 200680010862.6, Office Action dated Jun. 25, 2009, including Foreign Associate cover letter and English translation, 25 pages.

Chinese Patent Application No. 200680010862.6, instruction letter to client dated Feb. 1, 2010, 10 pages.

Chinese Patent Application No. 200680010862.6, Response to Office Action filed Mar. 2, 2010, including Foreign Associate cover letter, 22 pages.

Chinese Patent Application No. 200680010862.6, Office Action dated Mar. 29, 2010, including Foreign Associate cover letter and English translation only, 21 pages.

Chinese Patent Application No. 200680010862.6, instruction letter to client dated Aug. 5, 2010, 21 pages.

Chinese Patent Application No. 200680010862.6, Response to Office Action filed Aug. 23, 2010, including Foreign Associate cover letter, 19 pages.

Chinese Patent Application No. 200680010862.6, Office Action dated Nov. 23, 2010, including Foreign Associate cover letter and English translation, 12 pages.

Chinese Patent Application No. 200680010862.6, instruction letter to client dated Mar. 31, 2011, 28 pages.

(56) References Cited

OTHER PUBLICATIONS

Chinese Patent Application No. 200680010862.6, Response to Office Action filed May 16, 2011, including Foreign Associate cover letter, 25 pages.

Chinese Patent Application No. 200680010862.6, email instructions to Foreign Associate regarding telephone notification from examiner, dated Jul. 17, 2011, 4 pages.

Chinese Patent Application No. 200680010862.6, Notification of Granting A Patent Right, dated Sep. 7, 2011, including Foreign Associate cover letter and translation, 5 pages.

EP Patent Application No. 10011543.5 Response to Written Opinion dated Jul. 5, 2011, 20 pages.

Korean Patent Application No. 10-2007-7023966, Office Action dated Oct. 26, 2011, including partial translation, 6 pages.

Korean Patent Application No. 10-2007-7023966, Response to Office Action filed Jan. 26, 2012, including cover sheet translation, 10 pages.

Korean Patent Application No. 10-2007-7023966, Office Action dated Jul. 23, 2012, including partial translation, 5 pages.

Korean Patent Application No. 10-2007-7023966, Response to Office Action filed Sep. 21, 2012, including foreign associate cover letter, 30 pages.

Korean Patent Application No. 10-2007-7023966, Office Action dated Nov. 28, 2012, including partial translation, 5 pages.

Korean Patent Application No. 10-2007-7023966, Response to Office Action filed Jan. 17, 2013, including foreign associate cover letter, 14 pages.

Korean Patent Application No. 10-2007-7023966, Notice of Allowance dated Feb. 20, 2013, including translated allowed claims, 11 pages.

Korean Patent Application No. 10-2012-7002087; Notice to Submit Response dated May 15, 2012 including partial English translation, 5 pages.

Korean Patent Application No. 10-2012-7002087; Response to Office Action filed Jul. 13, 2013, including partial English translation, 13 pages.

Korean Patent Application No. 10-2012-7002087; Notice of Allowance dated Nov. 28, 2012, including partial English translation, 3 pages.

Microsemi Power Products Group, High Speed PT IGBT, APT80GA90LD40, Microsemi Website http://www.microsemi.com, Jun. 2009, 9 pages.

IEEE Guide for Control Architecture for High Power Electronics (1 MW and Greater) Used in Electric Power Transmission and Distribution Systems, IEEE Standards Association, IEEE Power & Energy Society, Feb. 11, 2011, 46 pages.

* cited by examiner

ADAPTIVE GATE DRIVE CONTROL METHOD AND CIRCUIT FOR COMPOSITE POWER SWITCH

CROSS REFERENCE TO RELATED APPLICATIONS

Not applicable

STATEMENT REGARDING FEDERALLY SPONSORED RESEARCH

Not Applicable.

FIELD OF THE INVENTION

Embodiments of the invention generally relate to semiconductors and systems. More particularly, the invention relates to systems, methods, and devices for operating, controlling, and monitoring power semiconductors and systems.

BACKGROUND OF THE INVENTION

Power semiconductor devices are well known to those of ordinary skill in the art and are commonly used for electronic power conversion, regulation, and control. As building blocks of power systems, power semiconductor devices operate in both a switching mode and a linear mode. Power semiconductors satisfy such conflicting requirements as low weight and volume, high circuit-level reliability, fault isolation, and diagnostic capabilities. Power transistors are a type of power semiconductor that is used in a variety of applications in the power range from watts to megawatts. While the majority of applications use power semiconductors in switched mode, other applications require devices to operate in the linear region. Such applications include constant-current capacitor charging and discharging, gradual voltage build up at the load ("soft start"), and switching of inductive loads.

Power semiconductors for switched-mode power conversion have to satisfy such conflicting requirements as high efficiency, high switching frequency, high circuit-level reliability, fault isolation, and diagnostic capabilities.

Composite ("Hybrid") Switch Configuration

Power semiconductors used for switched-mode electronic power conversion, regulation, and control in the range of tens to hundreds of kilowatts commonly operate at lower frequencies approximately below 50 kHz (for silicon devices), e.g., 10-10 kHz. For insulated gate bipolar transistors (IGBTs), this allows them to take an advantage of their lower conduction loss while maintaining acceptable switching losses. In a composite or "hybrid" switch configuration, an IGBT has a parallel-connected metal oxide semiconductor field effect transistor (MOSFET). FIG. 1 is a graph of a prior art Hybrid Switch Conduction Pattern. As FIG. 1 illustrates, as a "faster" device, the MOSFET is turned on first and conducts during the turn-on interval $\Delta T_1$ (FIG. 1). When the MOSFET is fully on, the IGBT turns on as well at the end of the turn-on interval $\Delta T_1$ and starts carrying the bulk of current during most of the on-time interval. Near the end of the conduction interval, the IGBT turns off (at zero voltage) while the MOSFET remains in the ON state for the duration of the turn-off interval $\Delta T_2$. When the IGBT current expires, the MOSFET turns off with low turn-off loss. Thus, the hybrid configuration combines the best properties of both types of semiconductors and allows power converters to operate at higher frequencies while maintaining high efficiency.

The Conventional Hybrid Switch Approach can have some problems, however. For example, one problem is suboptimum efficiency. In FIG. 1, and in prior art devices, the MOSFET conduction time intervals ($\Delta T_1$ and $\Delta T_2$) are fixed, because these intervals are designed for the worst case switching times for a given IGBT and cannot accommodate changing current, temperature and device to device variations. As a result, for most cases, the MOSFET conducts longer than necessary degrading the overall efficiency because its ON state loss is significantly higher than that of the IGBT.

Another problem is that the Static Forward and Reverse Biased Safe Operating Areas (FBSOA and RBSOA) Fixed Forward and Reverse Biased Safe Operating Areas can limit flexibility of a device to handle different types of conditions. The FBSOA curves define the maximum drain voltages and currents the device can sustain during its turn on or under forward-biased conditions. The RBSOA curve defines the peak drain current and voltage under inductive load turn off when the transistor drain voltage is clamped to its rated drain to source breakdown voltage BVDSS. For example, FIG. 2A is an exemplary graph of prior art MOSFET forward biased safe operating area (FBSOA) curves, and FIG. 2B is an exemplary graph of prior art MOSFET reverse biased safe operating area (RBSOA) curves. It might be expected that a transistor has to operate within fixed boundaries of the FBSOA and RBSOA under all conditions. However, these curves strictly limit only the maximum drain to source voltage ratings. Otherwise, as opposed to indicating absolute limits for a device, the Safe Operating Area (SOA) curves represent areas of "acceptable" reliability, which are often expressed as Mean Time Between Failures (MTBF). Also, the FBSOA curves normally show data for a single current pulse and several different pulse widths at the case temperature of 25° Celsius (C). Because most applications need continuous operation and higher case temperature, the FBSOA has to be recalculated for every specific case.

As a result, conventional hybrid switches cannot react to changing environmental or circuit conditions such as operating at a higher junction temperature in an emergency with reduced coolant flow or providing higher current to a stalled motor. Obviously, devices can be oversized, but it still does not prevent them from being underused in one mode of operation and overstressed in another.

A further issue is a lack of diagnostics and prognostics. At present, with the exception of some previous designs developed by one of the instant inventors (see, e.g., B. Jacobson, "Integrated Smart Power Switch", U.S. Pat. No. 7,839,201, November 2010 ('201 patent), as well as B. Jacobson, "Integrated Smart Power Switch, U.S. Pat. No. 8,076,967, November 2011 ('967 patent); the contents of each of these patent applications is hereby incorporated by reference in its entirety) it is not possible to determine if anything is wrong with working power semiconductors—it is only possible to examine failed devices and determine causes of failure. The common prediction method of power transistor reliability relies on the device junction temperature. It is based on theoretical models and does not take into account actual operating conditions. For example, with the exception of the inventor's prior patents, known methods generally do not account for a device failure caused by overstressed die contact to the substrate or faulty mounting to the heat sink. The aforementioned patents of the inventor do, however, address some of these concerns, with safe operating area (SOA) protection, and diagnostics algorithms.

A further issue with prior art devices and methods is lack of real-time calibration and inspection capability. No methods of inspecting and calibrating installed transistors according to their power handling capability exist at this time.

Still another issue with prior art devices and methods is that there often can be suboptimum reliability. The conduction pattern of the hybrid switch (see FIG. 1) is predetermined. That is, the hybrid switch of FIG. 1 has no provisions for adjusting time intervals $\Delta T_1$ and $\Delta T_2$. The fixed conduction pattern does not allow shifting the full load to a single semiconductor for a short time interval even if the controller detects an impending failure of the other device.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

In one aspect, the invention describes a new adaptive gate drive method and circuit for a hybrid switch comprising two different power semiconductors. In one aspect of the invention improvements to switched-mode operation of a hybrid switch are proposed, through controllable gate delays and selective modes of operation for the hybrid switch. The adaptive gate drive methods and circuits in the embodiments described herein help to overcomes at least some of the limitation of conventional drive methods and circuits and allow operation at high frequencies while maintaining high efficiency, improving reliability and optimizing performance of the hybrid switch. Although the applications of the invention described herein are described mainly in terms of applicability to power transistors, specifically Metal Oxide Silicon Field Effect Transistors (MOSFETs), Bipolar Junction Transistors, and Insulated Gate Bipolar Transistors (IGBTs), one of skill in the art will appreciate that the embodiments of the invention described herein are applicable to all power semiconductor devices. The detailed description herein explains features of the invention using MOSFET and IGBT properties and characteristics, but the invention is not limited by these examples.

In one embodiment, the inventors propose a new hybrid switch with adaptive gate drive circuit and control method. This new hybrid switch helps to overcomes at least some of the limitations of conventional hybrid switches and improves their efficiency, reliability and application flexibility. Building on Safe Operating Area (SOA), protection and diagnostics and prognostics algorithms as described in the aforementioned incorporated by reference prior patents, at least some embodiments of the invention improve operation of intelligent, reconfigurable converters and systems.

In a first embodiment the invention provides a hybrid switch circuit with adaptive closed-loop control of transition time intervals. Features of the closed loop control of this hybrid switch circuit include: sensing voltage across the switch to determine length of the turn-on transition time interval and comparing it with a reference signal, sensing current through the slower device (IGBT) to determine length of the turn-off transition time interval and comparing it with a reference signal, and modulating reference signals in accordance with switch environmental conditions (e.g. temperature) and load (e.g. current).

In a further aspect, the invention provides a hybrid switch control algorithm that implements adaptive control and correlates the length of transition time intervals with power dissipation of the faster switch (MOSFET).

In one embodiment, a variable conduction pattern allows shifting the load to a single device while keeping the other device off for a short time interval. For example, if an impending failure of one device is detected, it is beneficial to turn it off and keep the power converter operating with the remaining device in either of the three modes: (a) for a limited time, (b) at reduced power or (c) for a limited time and at reduced power. This feature allows an orderly switchover to another source or an extended operation for emergency conditions ("battle short").

In one embodiment, the invention provides a method of controlling a hybrid switch. A controllable hybrid switch is provided, the controllable hybrid switch comprising a first semiconductor switch operably coupled in parallel to a second semiconductor switch, each respective semiconductor switch being individually controllable and having a respective switching speed and a respective power-processing capability, wherein the first semiconductor switch has a faster switching speed than that of the second semiconductor switch and wherein the second semiconductor switch has a higher power-processing capability than that of the first semiconductor switch. First device data is accessed, where the first device data comprises a first reference value $V_{1REF}$ for a first default turn-on transition time interval $\Delta T_1$ and a second reference value $V_{2REF}$ for a second default turn-off transition time interval $\Delta T_2$. The controllable hybrid switch is enabled and controlled so that it operates in accordance with the first device data. The duration of the default $\Delta T_1$ and $\Delta T_2$ used to control operation of the controllable hybrid switch is dynamically adjusted so as to compensate for at least one of variations in a current to a load operably coupled to the controllable hybrid switch and environmental conditions at the controllable hybrid switch.

In a further embodiment, dynamic adjustment of the default $\Delta T_1$ and $\Delta T_2$ so as to compensate for variations in current to a load further comprises: monitoring a voltage across the controllable hybrid switch and a current through the second semiconductor device; if the voltage sensed across the controllable hybrid switch is less than $V_{1REF}$, adjusting $\Delta T_1$ so as to turn on the second semiconductor switch; and if the current sensed through the second semiconductor device is less than $V_{2REF}$, adjusting $\Delta T_2$ so as to turn off the first semiconductor switch.

In further embodiments, the monitoring of voltage and current occurs at least one of continuously and substantially periodically. In a still further embodiment, compensating for environmental conditions further comprises: monitoring a first operating temperature at the first semiconductor switch and a second operating temperature at the second semiconductor switch; and dynamically adjusting at least one of the default values $V_{1REF}$ and $V_{2REF}$ used to control operation of the controllable hybrid switch, the dynamic adjustment based at least in part on at least one of the monitored first operating temperature, the monitored second operating temperature, and the monitored first current through the second semiconductor switch, wherein the adjustment of the at least one of the default values $V_{1REF}$ and $V_{2REF}$ effectively also dynamically adjusts at least one of the default $\Delta T_1$ and the default $\Delta T_2$.

In yet another embodiment, second device data for the controllable hybrid switch is accessed, the second device data comprising: a first nominal junction temperature $T_{J1NOM}$ for the first semiconductor switch and a first nominal power threshold $P_{1NOM}$ for the first semiconductor switch. The operation of the controllable hybrid switch is controlled so that it operates in accordance with the both the first device data and the second device data, and junction temperature $T_{J1}$ and measured power $P_{M1}$ of the first semiconductor switch is monitored. If $T_{J1}$ is greater than $T_{1NOM}$ or if $P_{M1}$ is greater than or equal to $P_{1NOM}$, then a time delay is dynamically inserted to at least one of $V_{1REF}$ and $V_{2REF}$ used to control operation of the controllable hybrid switch, wherein the time delay comprises a period of time sufficient to settle at least one of the junction temperatures of the first semiconductor switch and the second semiconductor switch.

In a still further embodiment, third device data for the controllable hybrid switch is accessed, the third device data comprising: a second nominal junction temperature $TJ_{2NOM}$ for the second semiconductor switch; and a second nominal power threshold $P_{2NOM}$ for the second semiconductor switch. The operation of the controllable hybrid switch is controlled so that it operates in accordance with the both the first device data and the third device data. Junction temperature $T_{J2}$ and measured power $P_{M2}$ of the second semiconductor switch is monitored, as are junction temperature $T_{J2}$ and measured power $P_{M2}$ of the second semiconductor switch. If $T_{J2} \geq T_{2NOM}$ or if $P_{M2} \geq P_{2NOM}$, a notification is provided to report the difference.

In a further embodiment, the notification is provided to a control system in operable communication with the controllable hybrid switch, the control system constructed and arranged to control operation of the controllable hybrid switch.

In yet a further embodiment, device data for the controllable hybrid switch is accessed, the device data comprising: a first nominal junction temperature $T_{J1NOM}$ for the first semiconductor switch; a first nominal power threshold $P_{1NOM}$ for the first semiconductor switch; a second nominal junction temperature $TJ_{2NOM}$ for the second semiconductor switch; and a second nominal power threshold $P_{2NOM}$ for the second semiconductor switch. The controllable hybrid switch is enabled and controlled so that it operates in accordance with its device data. A first operating temperature at the first semiconductor switch and a second operating temperature at the second semiconductor switch are monitored, as are junction temperature $T_{J1}$ and measured power $P_{M1}$ of the first semiconductor switch and junction temperature $T_{J2}$ and measured power $P_{M2}$ of the second semiconductor switch. At least one of the default values $V_{1REF}$ and $V_{2REF}$ used to control operation of the controllable hybrid switch is dynamically adjusted, the dynamic adjustment based at least in part on at least one of the monitored first operating temperature, the monitored second operating temperature, and the monitored first current through the second semiconductor switch, wherein the adjustment of the at least one of the default values $V_{1REF}$ and $V_{2REF}$ effectively also dynamically adjusts at least one of the default $\Delta T_1$ and the default $\Delta T_2$ used to control the controllable hybrid switch. If $T_{J1}$ is greater than $T_{1NOM}$ or if $P_{M1}$ is greater than or equal to $P_{1NOM}$, then a time delay is dynamically inserted to at least one of $V_{1REF}$ and $V_{2REF}$, used to control operation of the controllable hybrid switch, wherein the time delay comprises a period of time sufficient to settle at least one of the junction temperatures of the first semiconductor switch and the second semiconductor switch. If $T_{J2} \geq T_{2NOM}$ or if $P_{M2} \geq P_{2NOM}$, then a notification is provided to report the difference.

In a still further embodiment, the first and second controllable semiconductor switches comprise one of the following pairings: the first controllable semiconductor switch comprises a controllable metal oxide semiconductor field effect transistor (MOSFET) and the second controllable semiconductor switch comprises a controllable insulated gate bipolar transistor (IGBT); or the first controllable semiconductor switch comprises a controllable IGBT and the second controllable semiconductor switch comprises a controllable thyristor.

In still another aspect, the invention provides a method for controlling the operation of a hybrid switch, the method comprising:

providing a controllable hybrid switch, the controllable hybrid switch comprising a first semiconductor switch operably coupled in parallel to a second semiconductor switch, each semiconductor switch being individually controllable and having a respective switching speed and a respective power-processing capability, wherein the first semiconductor switch has a faster switching speed than that of the second semiconductor switch and wherein the second semiconductor switch has a higher power-processing capability than that of the first semiconductor switch;

enabling the hybrid switch;

dynamically receiving data indicating operating condition information for at least one of the controllable hybrid switch, the first semiconductor switch, and the second semiconductor switch;

if the operating condition information indicates imminent failure of at least one of the first semiconductor switch, and the second semiconductor switch, then:

turning off the respective first or second semiconductor switch whose operating condition indicates the imminent failure; and dynamically controlling operation of the controllable hybrid switch by controlling operation of the other of the first and second semiconductor switches to be in at least one of three operating modes: operating for a limited time, operating at reduced power, or operating for both a limited time and at reduced power.

In a further embodiment of this aspect, if the controllable hybrid switch is operated for either a limited time or for a limited time at reduced power, the method further comprises shutting down the controllable hybrid switch when the limited time is expired. In a still further embodiment, the method further comprises sending a notification when the controllable hybrid switch is shut down.

In a still further embodiment, the method further comprises:

if the operating condition information indicates that either the first or second semiconductor switch is in a condition of imminent failure, determining whether power to the respective first or second semiconductor switch that is not in the condition of imminent failure, can be reduced;

if the power to the respective first or second semiconductor switch that is not in condition of imminent failure cannot be reduced:

shutting down the respective first or second semiconductor switch in the condition of imminent failure;

determining time to shutdown of the controllable hybrid switch;

providing a first notification related to a time to shutdown of the controllable hybrid switch; and shutting down the controllable hybrid switch after the time to shutdown has expired.

In a still further embodiment of this aspect, if power to the respective first or second semiconductor switch that is not in the condition of imminent failure, can be reduced, then the method further comprises:

shutting down the respective first or second semiconductor switch in the condition of imminent failure;

dynamically controlling operation of the other first or second semiconductor switch not in the condition of imminent failure such that it operates at a reduced power;

shutting down, after a first predetermined time, the first or second semiconductor switch that that is operating at reduced power; and shutting down the controllable hybrid switch after shutting down the first or second semiconductor switch that is operating at reduced power.

In still another embodiment, if the operating condition information indicates imminent failure of at least one of the first semiconductor switch and the second semiconductor switch, the method further comprises:

accessing device data associated with the other of the respective first or second semiconductor switch, where the other respective first or second semiconductor switch is not in imminent failure, the device data comprising at least one of a default drain to source voltage ($V_{DS}$) boundary, a default power boundary (PB), a default RMS current boundary ($I_{DRMS}$), a default $R_{DS(on)}$ limited current boundary, Switching Safe Operating Area (SSOA), breakdown collector to emitter voltage boundary $V_{CES}$ and pulsed collector current $I_{CM}$;

computing, for each respective junction temperature of the first or second semiconductor switch not in imminent failure, in a predetermined range of temperatures, a set of boundaries, each respective boundary based on the device data for the respective first or second semiconductor switch and on a predetermined reliability characteristic as a function of drain current $I_D$ and drain to source voltage $V_{DS}$ for the respective first or second semiconductor switch, wherein each respective boundary defines a respective SOA;

monitoring, for the respective first or second semiconductor switch not in imminent failure, a junction temperature of the respective first or second semiconductor switch;

selecting an SOA based on the predetermined reliability characteristic that is desired; and dynamically controlling operation of the respective first or second semiconductor switch in accordance with the respective boundary associated with the selected SOA and predetermined reliability characteristic that is desired.

In yet another embodiment of this aspect, the method further comprises:

determining an operating condition for at least one of the controllable hybrid switch, the first semiconductor switch, and the second semiconductor switch, the determining comprising:

monitoring an operating parameter of at least one of the controllable hybrid switch, the first semiconductor switch, and the second semiconductor switch;

accessing device data for the at least one of the controllable hybrid switch, the first semiconductor switch, and the second semiconductor switch that is being monitored;

determining a predicted value of the operating parameter based on the device data; and comparing the predicted value of the operating parameter with the monitored operating parameter to determine whether a predetermined operating condition exists for the at least one of the controllable hybrid switch, the first semiconductor switch, and the second semiconductor switch, the predetermined operating condition indicating that the respective at least one of the controllable hybrid switch, the first semiconductor switch, and the second semiconductor switch is in danger of imminent failure.

In still another embodiment, the predetermined operating condition comprises at least one of over-temperature, current tunneling, excessive power, over-current, over-voltage, a coolant problem, a heat sink problem, a die defect, a die bonding defect, a die attachment defect, a device package mounting defect, and an environmental condition.

In a still further aspect of the invention, the invention provides a controllable hybrid switch comprising first and second semiconductor switches and first and second sets of sensors. The first semiconductor switch is controllable and has a first switching speed and a first power-processing capability. The second semiconductor switch is operably coupled in parallel to the first semiconductor switch, the second semiconductor switch being controllable and having a second switching speed that is slower than the first switching speed and a second power-processing capability that is larger than the first power-processing capability. The first set of sensors senses a first set of operating parameters for the first semiconductor switch, the first set of operating parameters including at least a first junction temperature, a first voltage across the first semiconductor switch, and a first current through the first semiconductor switch. The second set of sensors senses a second set of operating parameters for the second semiconductor switch, the second set of operating parameters including at least a second junction temperature, a second voltage across the second semiconductor switch, and a second current through the second semiconductor switch. The first and second semiconductor switches and first and second sets of sensors are constructed and arranged to be in operable communication with a controller, wherein the controller is programmed to: access first device data for the controllable hybrid switch, the device data comprising a first reference value $V_{1REF}$ for a first default turn-on transition time interval $\Delta T_1$ and a second reference value $V_{2REF}$ for a second default turn-off transition time interval $\Delta T_2$; enable the controllable hybrid switch and control the operation of the controllable hybrid switch so that it operates in accordance with the first device data; and dynamically adjust the duration of the default $\Delta T_1$ and $\Delta T_2$ used to control operation of the controllable hybrid switch, so as to compensate for at least one of variations in a current to a load operably coupled to the controllable hybrid switch and environmental conditions at the controllable hybrid switch.

In a still further embodiment, the controller is further programmed to: dynamically receive data indicating operating condition information for at least one of the controllable hybrid switch, the first semiconductor switch, and the second semiconductor switch; and if the operating condition information indicates imminent failure of at least one of the first semiconductor switch, and the second semiconductor switch, then: turn off the respective first or second semiconductor switch whose operating condition indicates the imminent failure; and dynamically control operation of the controllable hybrid switch by controlling operation of the other of the first and second semiconductor switches to be in at least one of three operating modes: operating for a limited time, operating with reduced power, or operating for both a limited time and at reduced power.

In a still further embodiment, the first and second controllable semiconductor switches comprise one of the following pairings: the first controllable semiconductor switch comprises a controllable metal oxide semiconductor field effect transistor (MOSFET) and the second controllable semiconductor switch comprises a controllable insulated gate bipolar transistor (IGBT); or the first controllable semiconductor switch comprises a controllable IGBT and the second controllable semiconductor switch comprises a controllable thyristor.

Details relating to these and other embodiments of the invention are described more fully herein.

BRIEF DESCRIPTION OF THE DRAWINGS

The advantages and aspects of the present invention will be more fully understood in conjunction with the following detailed description and accompanying drawings, in which.

The drawings are not to scale, emphasis instead being on illustrating the principles of the invention. In addition, in the drawings, like reference numbers indicate like elements.

DETAILED DESCRIPTION OF THE INVENTION

The description below explains certain features of the invention by providing examples using MOSFET and IGBT devices, properties and characteristics. It should be understood, however, that the concepts and embodiments of the invention described herein apply to many other types of semiconductor devices, including but limited to controllable semiconductors, three terminal semiconductors, and such power semiconductors as Bipolar Junction Transistors (BJTs), Insulated Gate Bipolar Transistors (IGBTs), and controllable thyristors, including Gate Turnoff (GTO) thyristors, Gate-Commutated Thyristor (GCT), Integrated Gate-Commutated Thyristor (IGCT) and Emitter Turnoff (ETO) thyristors.

Figure 1:
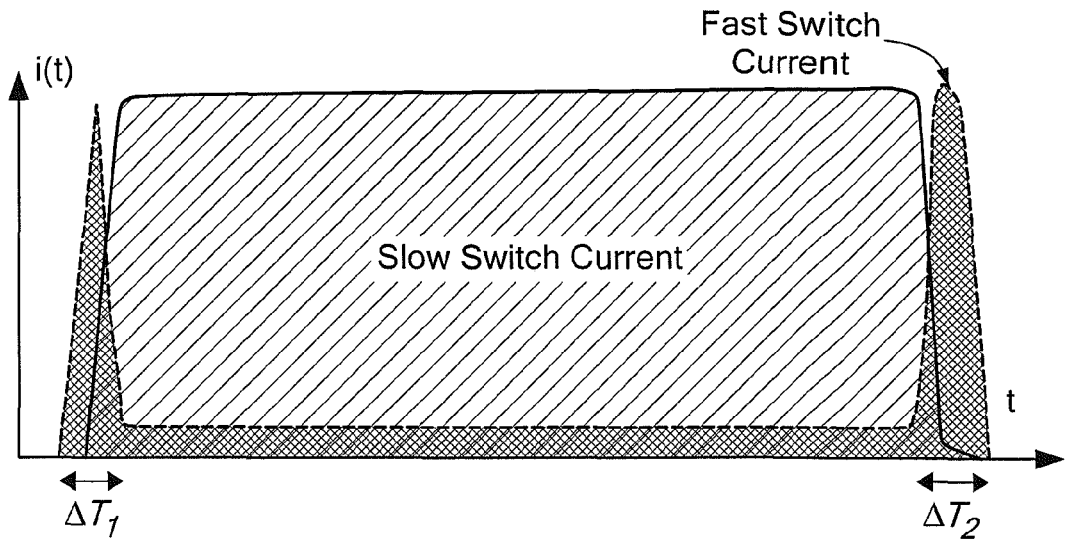
FIG. 1 is a graph of a prior art Hybrid Switch Conduction Pattern for the Hybrid Switch.
Figure 2A:
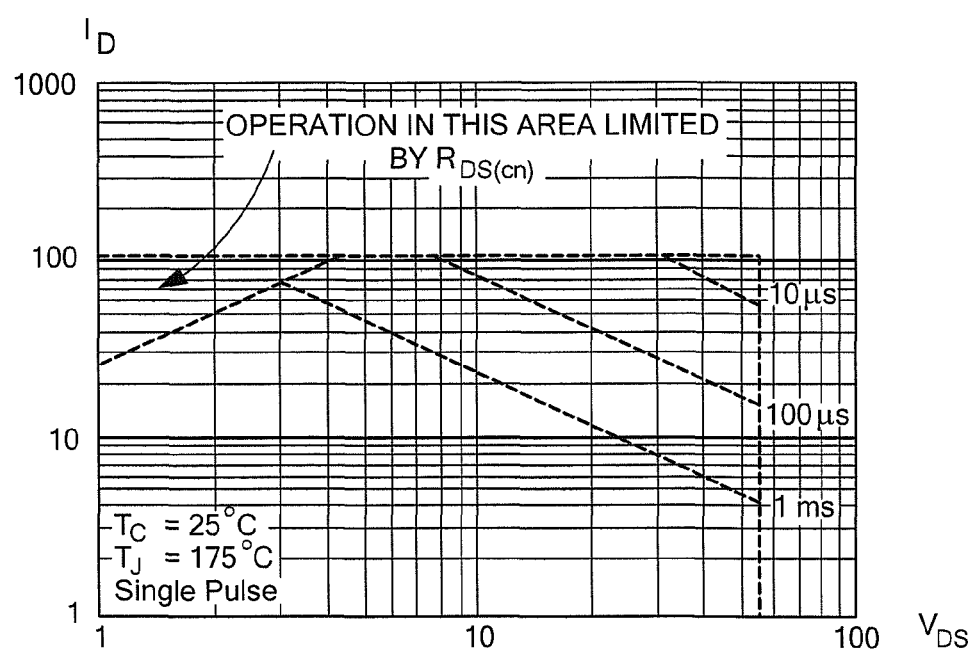
FIG. 2A is an exemplary graph of prior art MOSFET forward biased safe operating area (FBSOA) curves.
Figure 2B:
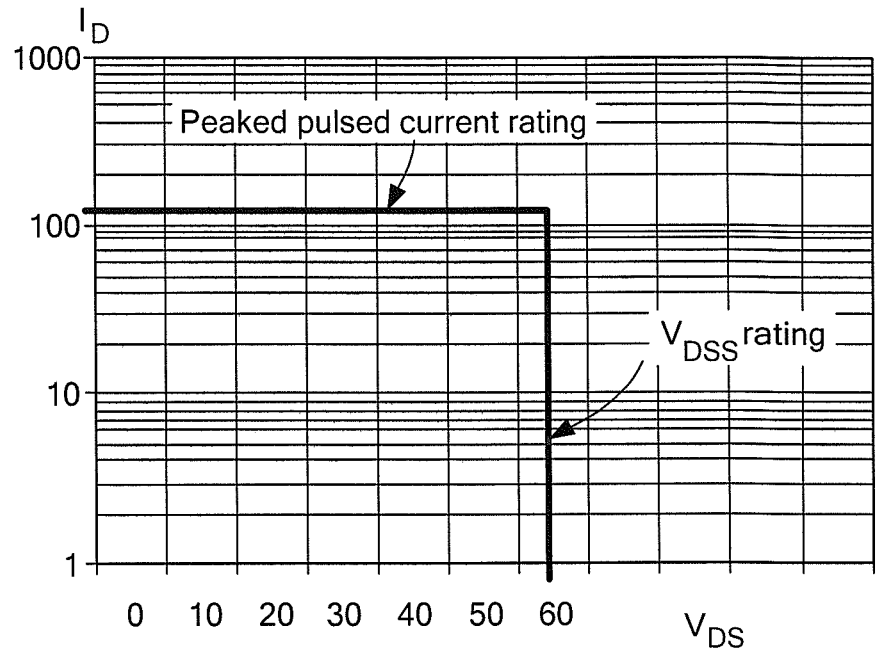
FIG. 2B is an exemplary graph of prior art MOSFET reverse biased safe operating area (RBSOA) curves.
Figure 3A:
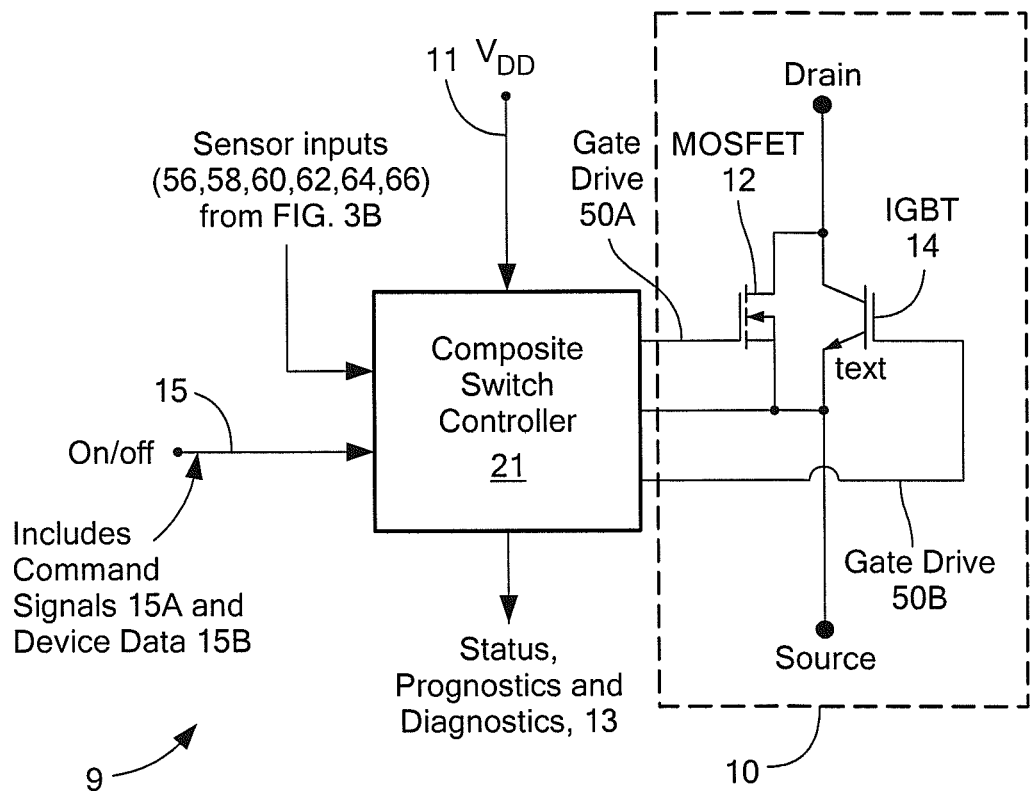
FIG. 3A is a first illustrative block diagram of a hybrid switch with adaptive gate driver, in accordance with one embodiment of the invention.
Figure 3B:
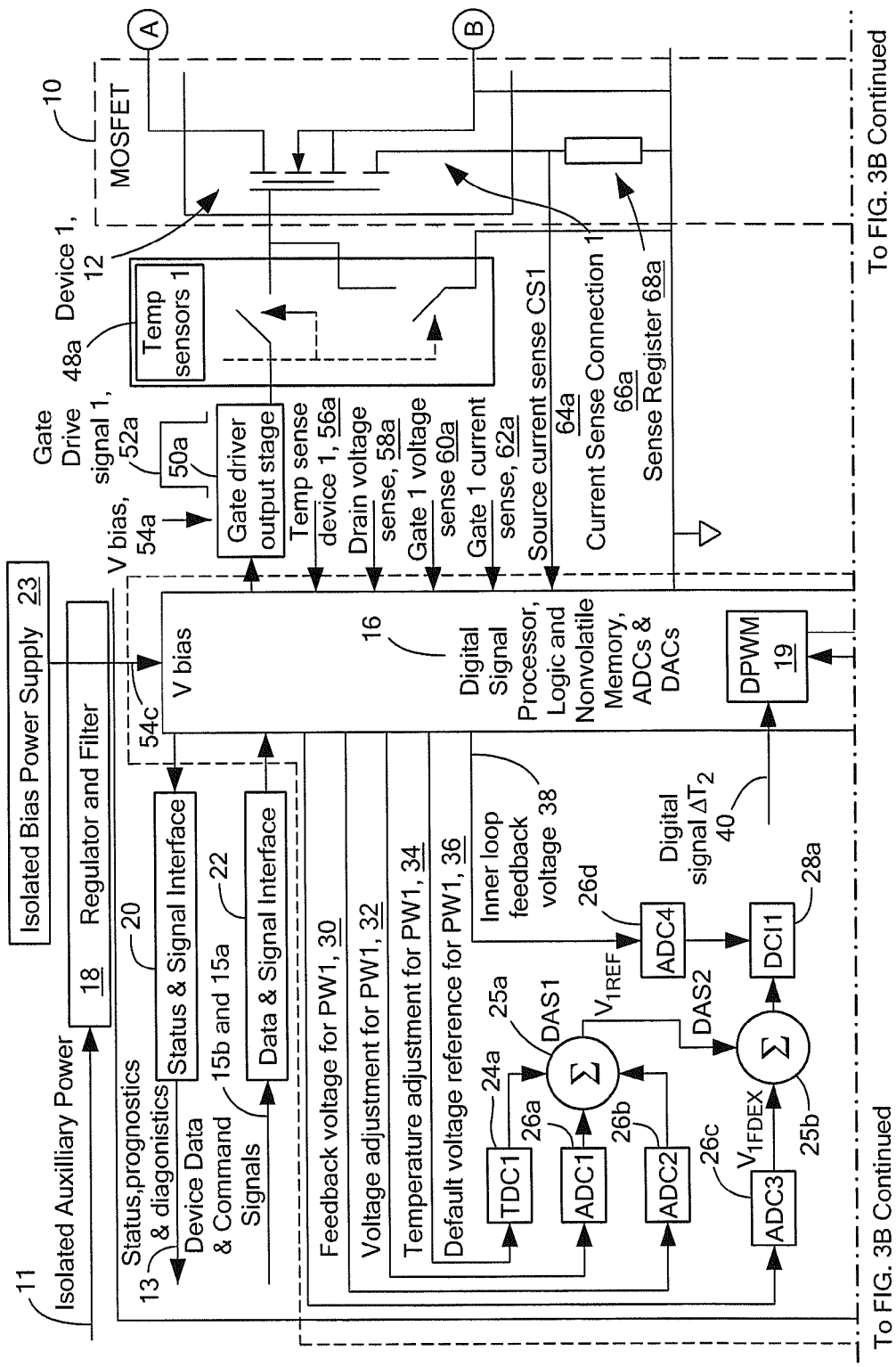
FIG. 3B is a second illustrative block diagram showing further details of the new hybrid switch with adaptive gate driver of FIG. 3A, in accordance with one embodiment of the invention.
Figure 3B:
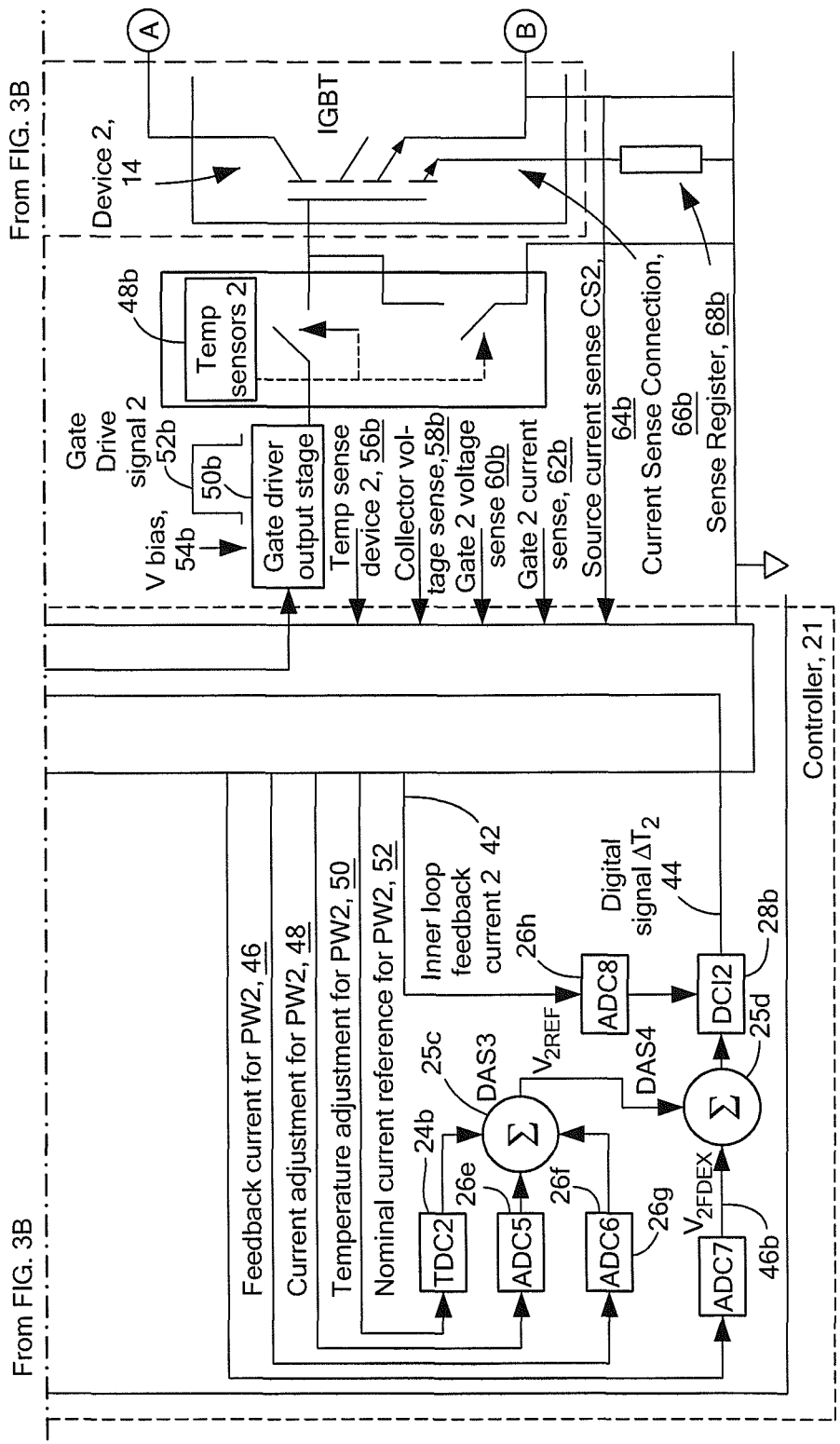
Figure 15:
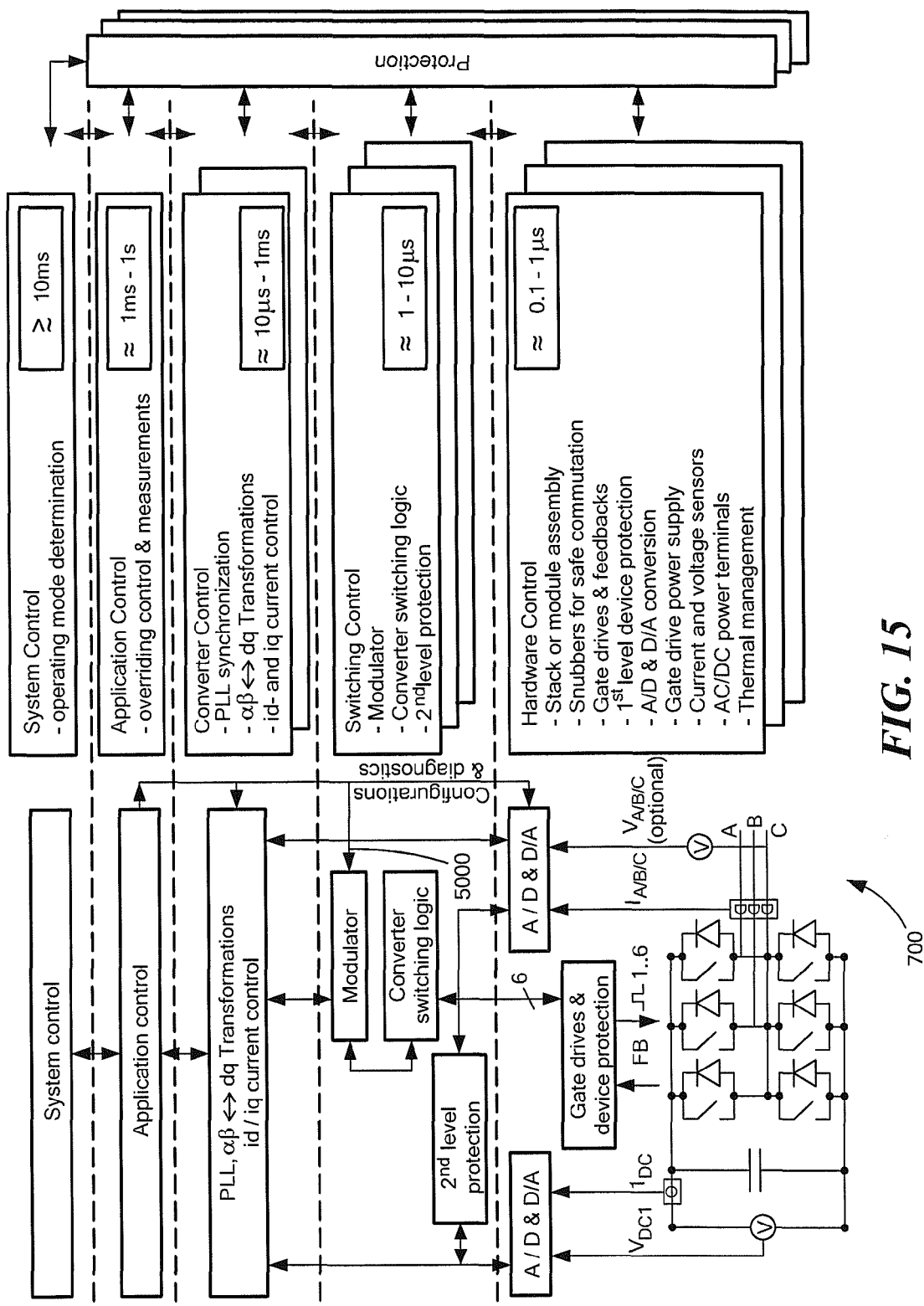
FIG. 15 is a block diagram of a prior art power system architecture having several layers of control and usable with at least some embodiments of the invention.

FIGS. 3A and 3B show an illustrative block diagram 9 for a hybrid switch 10 with adaptive gate driver and controller 21, in accordance with one embodiment of the invention. FIG. 3A is the simplified block diagram view, and FIG. 3B is the more detailed block diagram view. In addition, in both FIG. 3A and FIG. 3B, although not illustrated in these figures, the hybrid switch 10 can, of course, be connected to other devices or assemblies, such as an external load and/or a system application layer or a control layer, as one of skill in the art will appreciate. Note that, in the block diagrams of FIGS. 3A and 3B, for simplicity, many connections are shown in a simplified form, with a single line indicating each connection. For example, in FIG. 3B, the temp sensors 1 (48A) may be monitoring the MOSFET 12 at more than one location, and may provide more than one signal to the controller 21, but FIG. 3B still illustrates a single connection line of Temp sense device 1 (56A), which provides signals from the Temp Sensors 1 (48A) to the DSP 16. Note also, that in the embodiment of FIGS. 3A and 3B, the controller 21 is separate from the hybrid switch 10 (although operably in communication with it). It also will be further understood by those of skill in the art (as the methods of FIGS. 4-8 and 11 further illustrate) that, in at least some embodiments, there are other controllers corresponding to different "control layers" in the overall control system hierarchy. For example, in one embodiment (e.g., blocks 610, 632, and 650 of FIG. 6), the device-level controller 21 sends a request to reduce power, and this request is, effectively sent to a higher-level controller (e.g. an "application-level" controller). An illustrative example of a prior art power system architecture having various control "layers" (e.g., application level, device level, etc.) that is usable with at least some embodiments of the invention is shown in FIG. 15. The architecture of FIG. 15 is adapted from the one shown in FIG. 1 of Institute of Electrical and Electronics Engineers (IEEE) standard 1676-2010, "IEEE Guide for Control Architecture for High Power Electronics (1 MW and Greater) Used in Electric Power Distribution and Transmission Systems", (11 Feb. 2011), which is hereby incorporated by reference.

Referring briefly to FIG. 15, the architecture 5000 is part of a common design intended to be used with and for multiple applications, as is understood by those of skill in the art. The architecture 5000 includes a system control layer that determines the overall mission of the system (and which typically includes human-machine interfaces); an application control layer responsible for maintaining overall functions of the power electronics (and which dictates the operation of the power electronics system to meet the mission determined by the system control); a converter control layer that implements many common functions of converters (including a feedback control system, synchronous timing, and current and voltage measurement filtering); a switching control layer that handles the switching/logic sequence (which includes modulation control and pulse generation), and the hardware control layer that manages everything specific to the power hardware/power devices. Each layer has characteristic processing and communication speed requirements, irrespective of the final applications.

In one embodiment, the controller 21 for the embodiments of the invention described herein resides, in one embodiment, at the "lowest" control layer of the system 5000 of FIG. 15, the hardware control layer, whereas the command signals 15A sent to the controller 21 come from a higher level in the system 5000, e.g., the switching control layer. In an advantageous embodiment, the hybrid switch 10 with adaptive gate driver portion of the system belongs to the hardware control group/hardware control layer that is operating at the highest speed. In one embodiment, the combination of the controller 21 and one or more of the other control layers of the system 5000 can be viewed as an external control system for the hybrid switch 10.

Referring again to FIGS. 3A and 3B, it also should be understood that in a further embodiment, the hybrid switch 10 is implemented to include at least some controller 21 functionality within the switch device 10 itself. For example, in one implementation, the hybrid switch 10 can be implemented to include fixed delays to the common gate drive (e.g., 50A and 50B in FIG. 3B) coming from a conventional controller (i.e. the controller that operates a single switch). In a further embodiment, as will be understood, the invention is implemented such that the controller 21 is part of the hybrid switch 10.

Referring again to both FIGS. 3A and 3B, the components of one embodiment of the hybrid switch 10 with adaptive gate driver include two controllable semiconductor devices, e.g., semiconductor switches (which in this exemplary embodiment are a MOSFET 12 and IGBT 14), connected in parallel, each controlled by the composite switch controller 21, where the composite switch controller 21 receives a number of sensor inputs (56, 58, 60, 62, 64, 66) from temperature, current, and voltage sensors sensing data relating to the MOSFET 12 and IGBT 14. The controller 21 also receives command signals 15A and device data 15B (i.e., device data providing device data information about the MOSFET 12 and IGBT 14), and all appropriate power supply voltages and bias voltages are provides, as well. As noted above, in one embodiment, the command signals 15A and/or the device data 15B can be sent to the controller 21 by another control layer (not shown) in a system in which the hybrid switch 10 and controller 21 are embodied.

Note that, in FIG. 3B, the parallel connection between the MOSFET 12 and the IGBT 14 are illustrated via the point labeled "A" at the drain end of the MOSFET 12 being operably coupled to the corresponding point labeled "A" at the collector end of IGBT 14, as well as via the point labeled "B" at the source end of the MOSFET 12 being operably coupled to the corresponding point labeled "B" at the emitter end of IGBT 14.

The MOSFET 12, in the example embodiment of FIGS. 3A and 3B, is a fast-switching, controllable power semiconductor, having high power density, low processing power, high conduction loss, and low switching loss. The IGBT 14, in the example embodiment of FIGS. 3A and 3B, is a slow-switching, low power density, high processing power, low conduction loss, and high switching loss device. In contrast, the combination of the MOSFET 12 and the IGBT, as shown in FIGS. 3A and 3B, into a "smart" (i.e., intelligently controlled by controller 21) hybrid switch, results in a switch with fast switching, high power density, high processing power, low conduction loss, and low switching loss. In at least some embodiments, one requirement of any combination of first switch and second switch connected in parallel is that there is a first "faster" switch (having a faster switching speed) and a second "slower" switch (having a slower switching speed, as compared to the first "faster" switch), where the second "slower" switch has a higher current-carrying/power-processing capability as compared to the first "faster" switch. Thus, within the context of these requirements, various embodiments the invention can be implemented using various combinations of switching devices, not just combinations using a MOSFET and IGBT. This is discussed further below.

Note that, if the second "slower" switch were instead to have a lower current-handling/power-processing capability, the faster device would, effectively, handle all of the switching requirements and power handling on its own, which would not produce as advantageous result as the proposed combination of a faster switching, lower power-handling switch in parallel with a slower switching, higher power handling switch.

Note that, in the context of these requirements the hybrid switch 10 may be implemented using subsets of the general parallel connection illustrated in FIG. 3A by adding switches of either type. For example, in one embodiment, if it is desirable to expand into the area of higher currents, additional IGBTs may be added in parallel to the original IGBT 14. On the other hand, in another embodiment, if the hybrid switch 10 is intended for a high voltage application beyond the MOSFET's 12 rated voltage, additional MOSFETs may be added in series with the original device. Then, the resultant series connected string of MOSFETs is connected in parallel with the IGBT 14. Notably, appropriate voltage-sharing components should be connected across individual MOSFETs following a method well known to designers skilled in the art.

In addition, as will be described further herein, the hybrid switch 10 with adaptive gate drive provides adaptive closed-loop control of the transition time intervals $\Delta T_1$ and $\Delta T_2$, individually controlling the transition time intervals $\Delta T_1$ and $\Delta T_2$. This enables high power converters that include the hybrid switch 10 to operate at higher frequency and high efficiency. In addition, the adaptive control methods, as described herein, include Safe Operating Area (SOA), Protection and Diagnostics, and Prognostics. These methods improve reliability of devices that include the hybrid switch 10 and reduce total cost of ownership, including improved survivability and reduced maintenance, as well as lower fuel consumption.

An illustrative example of a MOSFET usable for at least some embodiments of the invention is a 1000 V, 37 A, 0.21 ohms MOSFET having part number APT25M100J, available from Microsemi Corporation's Power Products Group of Bend, Oreg. An illustrative example of an IGBT usable for at least some embodiments of the invention is a 900 V, 80 A @ 125° C. (145 A @ 25° C.) APT80GA90LD40 available from Microsemi Corporation's Power Products Group of Bend, Oreg. (note that this IGBT is a so-called "punch through" IGBT, but the invention is not so limited). The MOSFET 12 and IGBT 14 of FIGS. 3A and 3B are each associated with various operating parameters, some of the parameters relating to parameters that can be externally controlled, some of the parameters being measurable (e.g., by a sensor), and some of the parameters being associated with the respective semiconductor device (i.e., the MOSFET 12 and/or the IGBT 14) itself. For example, operating parameters that can be measured include (but are not limited to) drain voltage, gate voltage, gate current, average drain device current, peak drain current, RMS drain current, die temperature, case temperature, junction temperature ($T_J$), switching frequency, and duty cycle.

Operating parameters of the MOSFET 12 semiconductor device that can be controlled (e.g., by the controller 21 or other external control) include (but are not limited to): gate drive, transistor bias, a safe operating area (SOA) condition, a drain to source voltage threshold ($V_{DS}$) an RMS drain current threshold ($I_{DRMS}$), a forward and reverse bias safe operating area (SOA) pulse current threshold, ($I_{DM}$), a forward bias SOA drain current ($I_D$) boundary limited by drain to source on resistance ($R_{DS(on)}$), operating area of the power device. Operating parameters of the IGBT semiconductor device that can be controlled (e.g., by the controller 21 or other external control) include (but are not limited to): gate drive, transistor bias, a safe operating area (SOA) often referred to as a short circuit safe operating area (SCSOA), an RMS collector current threshold ($I_{CRMS}$), a pulsed collector current threshold ($I_{CM}$), a reverse bias safe operating area (RBSOA) pulse voltage thresholds, ($I_{CW1}$ and $V_{CE2}$).

Operating parameters of the MOSFET semiconductor device 12 associated with the device itself include (but are not limited to) device data 15B such as: breakdown drain to source voltage $BV_{DSS}$, breakdown drain to source voltage $BV_{DSS\_p}$ protection threshold, rated drain to source voltage $V_{DSS}$, rated drain to source voltage $V_{DSS}$ protection threshold, maximum single pulse current $I_{DM}$, maximum single pulse current $I_{DM}$ protection threshold, continuous drain current $I_D$, continuous drain current $I_D$ protection threshold, avalanche current $I_{AR}$, avalanche current $I_{AR}$ protection threshold, default Forward Biased Safe Operating Area (FBSOA) for a single pulse at a predetermined junction temperature $T_j$, default Reverse Biased Safe Operating Area (RBSOA) for a for a single pulse at a predetermined junction temperature $T_j$, a junction-to-case transient thermal impedance curve for at least one of normal and avalanche modes, a default drain to source voltage ($V_{DS}$) boundary, a default power boundary (PB), a default RMS current boundary ($I_{DRMS}$), a default $R_{DS(on)}$ limited current boundary; heat sink to case thermal impedance $Z_{thhc}$, junction to case thermal impedance $Z_{thjc}$, on state resistance at a predetermined temperature T ($R_{DS(on)(at\ temp\ T)}$, normalized on state resistance $R_{DS}(ON)$ versus temperature, heat sink temperature $T_{HS}$ as a function of dissipated power $T_{HS}(P_M)$, junction temperature $T_J$ threshold, reverse recovery charge of the integral body diode $Q_{rr}$ and reverse recovery time $t_{rr}$. of the integral body diode $Q_{rr}$.

Operating parameters of the IGBT semiconductor device 14 associated with the device itself include (but are not limited to) device data 15B such as: breakdown collector to emitter voltage $V_{CES}$, collector to emitter saturation voltage $V_{CES(sat)}$, pulsed collector current $I_{CM}$, pulsed current $I_{CM}$ protection threshold, continuous collector current $I_C$, continuous collector current $I_C$ protection threshold, Reverse Biased Safe Operating Area (RBSOA) for a predetermined junction temperature $T_j$, a turn-on delay time $T_{d(on)}$, a rise time $T_r$, a turn-off delay time $T_{d(off)}$, a fall time $T_f$, turn-off switching energy $E_{off}$, turn-on switching energy $E_{on}$, a junction-to-case transient thermal impedance curve for normal mode, Switching Safe Operating Area (SSOA), breakdown collector to emitter voltage boundary $V_{CES}$ and pulsed collector current $I_{CM}$, heat sink to case thermal impedance $Z_{thhc}$, junction to case thermal impedance $Z_{thjc}$, heat sink temperature $T_{HS}$ as a function of dissipated power $T_{HS}(P_M)$ and junction temperature $T_J$ threshold. Note that one of skill in the art may derive an equivalent for the default RDS(on) limited current boundary because at very low currents an IGBT has a forward voltage drop equal to that of a diode ("elbow") effect. However, in many applications, this may be of no importance, especially if the IGBT is connected in parallel to a MOSFET. In this example, all current will go to the MOSFET because it has no such voltage drop.

The device data 15B described above can, for example, be provided as part of a manufacturer's data sheet and can be provided to the controller 21, e.g., in advance, as needed, dynamically, etc. In one embodiment, the controller 21 accesses device data 15 as needed, where the device data is located external to the hybrid switch 10. In another embodiment, the controller 21 receives and stores device data 15 in its built-in memory (e.g., the nonvolatile memory 17 of FIG. 3B, shown as part of DSP 16.)

Operating parameters can also include environmental or other types of parameters (e.g., mechanical parameters, if applicable) that may affect operation of the hybrid switch 10. Environmental parameters include, but are not limited to, temperature, coolant flow, a moisture level, and current drawn by an external load. Although the illustrative embodiments of the hybrid switch 10 described herein does not specifically measure mechanical parameters, those of skill in the art will appreciate that mechanical parameters include, but are not limited to, stress, strain, force, movement, vibration, acceleration, and shock. In some instances, however, the hybrid switch 10 is used in connection with other devices and/or systems that do measure mechanical parameters and, where applicable, the methods of FIGS. 4-8 and 11 described herein do utilize such mechanical parameter measurements. As those skilled in the art appreciate, environmental parameters, especially temperature and moisture level, can have a significant effect on the performance of a semiconductor device. Similarly, mechanical parameters can affect semiconductor device performance, especially if the mechanical parameter causes physical damage to all or part of the semiconductor device.

Referring still to FIGS. 3A and 3B, the sensors (e.g., temp sensors 48A, 48B; current sense connections 64A, 64B; temp sense devices 56A, 56B; drain voltage sense 58A, 58B; gate voltage sense 60A, 60B; gate current sense 62A, 62B; source current sense 64A, 64B; and sense resistors 68A, 68B) can each be implemented using any device known in the art that is adapted for sensing one or more the operating parameters described above. Advantageously, at least some embodiments of the invention use a plurality of sensors. The applicable sensors can, for example, be a voltage sensor, a current sensor, a temperature sensor, a mechanical sensor (if applicable, as noted above), etc. As illustrated in FIG. 3B, at least one of the sensors can be a temperature sensor. The hybrid switch 10 of FIG. 3B also includes current sense 62, 64, including sense resistors 68A, 68B. Further, although for clarity not each type of sensor is explicitly depicted in FIG. 3A, the operating parameter data collected/sensed by the sensors is illustrated, by way of example, in FIG. 3B as the inputs to the controller 21 labeled as "Temp Sense", "Drain Voltage Sense," "Gate Voltage Sense", "Gate Current Sense", and "Source Current Sense", etc.

In at least one embodiment, any one or more of the aforementioned sensors in FIG. 3B is configured to sense the same parameter at more than one location on the hybrid switch 10, as an aid to detecting certain types of errors and problems. For example, in one embodiment, the temp sensors 48A, 48B are each configured to sense temperature at more than one location on the respective semiconductor device (i.e., either the MOSFET 12 or the IGBT 14), such as temperature at center of a die, temperature at one or more spots on periphery of the die, and the like. As is known in the art, when a semiconductor device develops a problem such as current tunneling, the temperature in the center of the die exceeds temperature at its periphery. Thus, the detection of temperature difference between the center of the die and its periphery indicates the onset of current tunneling.

As those skilled in the art will appreciate, there are multiple ways to implement each of the sensors shown in FIGS. 3A and 3B. For example, a sensor can be implemented as a plurality of discrete sensors, as a single sensor with multiple inputs for various respective points, and many other configurations, depending on the particular application. One or more of the sensors of FIGS. 3A and/or 3B can also be part of the other elements of the hybrid switch 10, such as the MOSFET or IGBT's themselves, the controller 21, an ADC, etc.

The controller 21 of FIG. 3A is a programmable device capable of: (a) receiving inputs from one or more sensors; (b) receiving bias power 11; (c) receiving command/control signals 15A and accessing and/or storing device data 15B associated with the MOSFET 12 and/or the IGBT 14; (e) processing one or more of the (a) through (d) this information to control operation of the MOSFET 12 and IGBT 14; and (e) (optionally) providing status/notification signals 13. As described further herein, in one embodiment, the status/notification signals 13 are provided to a higher level control system/control layer, such as a higher level control layer as illustrated in FIG. 15 (which illustrates a prior art power control system usable with at least some embodiments of the invention). In a still further embodiment, the status/notification signals can, of course, be provided to another entity, a user, etc. As illustrated in the exemplary embodiment of FIG. 3B, the functionality of the controller 21 is accomplished via the combination of operation of the DSP 16 block (which includes logic, nonvolatile memory 17, Analog-to-Digital Converters (ADCs), Digital to Analog Converters (DACs), a digital pulsewidth modulator 19) with all of the other components shown within the dashed line of FIG. 3B. These components are described further below.

As shown in FIG. 3B, in one embodiment, the controller 21 includes an on-board regulator and filter 18, an input 54C receiving bias power 11 (such as isolated bias power), input and output signals interface including an first interface 20 for providing status, prognostic, and diagnostic information and a second interface 22 for receiving device data and command signals 126. In a further embodiment (not shown in FIG. 3B, but understandable by those of skill in the art) the controller 21 further includes one or more gate driver circuits (such as the UCD7100 available from Texas Instruments of Dallas, Tex.), a further digital signal processor (DSP) or microcontroller optionally having nonvolatile memory (e.g., to store device data), and analog/digital (A/D) and digital/analog (D/A) converters.

The controller 21 advantageously is programmable to implement one or more of the methods of FIGS. 4-8 and 11, which are described below. These methods implement at least some new features of the invention, including but not limited to adaptive gate drive and correlating the length of the transition time intervals with the power dissipation of the faster switch, as well as the combination of these new features with the inventive methods of the aforementioned and incorporated-by-reference '201 and '967 patents, including at least current tunneling protection, dynamic Safe Operating Area, diagnostics and prognostics, and calibration of installed devices. As those skilled in the art will appreciate, the methods of FIGS. 4-8 and 11 (as well as the related information in FIGS. 9 and 10) are applicable to, and can be adapted for, virtually any type of power device, although by way of example the methods are particularly illustrated using the hybrid switch 10 of FIGS. 3A and 3B, implemented using a MOSFET 12 and an IGBT 14, as well as the four-quadrant bidirectional switch 1000 of FIG. 12 (described further herein), the power system 2000 of FIG. 13, and the bidirectional power converter with hybrid switches of FIG. 14, which are discussed further herein.

During operation of the hybrid switch 10, the controller 21 controls operation of both the MOSFET 12 and IGBT 14, dependent upon inputs from the various sensors (e.g., as a feedback loop, with the controller 21 providing feedback signals to adjust voltage, current, and temperature adjustments for the pulsewidths PW1 (for the MOSFET 12) and PW2 (for the IGBT 14)), where the controller 21, in at least one embodiment, provides the feedback signals to a higher level control layer, as shown in FIG. 15, wherein the higher level control layer responds with appropriate command signals 15A to cause the voltage, current, and temperature adjustments to occur. The controller 21 senses the voltage across the MOSFET switch 12 to determine the length of the turn-on transition time interval and compares it with a reference signal. Note that the reference signals $V_{1REF}$ and $V_{2REF}$ that the turn-on transition time interval is being compared with (e.g., in the method of FIG. 5) are reference signals whose values are, in one embodiment, stored in the controller 21. As one of skill in the art will appreciate, the values of $V_{1REF}$ and $V_{2REF}$ are, in one embodiment, represented as look-up tables based on the device data associated with the MOSFET switch 12. For example, for the aforementioned APT25M100J device, an exemplary turn-on delay is 44 ns, an exemplary rise time is 40 ns, an exemplary turn-off delay time is 150 ns and an exemplary fall time is 38 ns (all values are typical).

Referring still to FIGS. 3A and 3B, the controller 21 also senses the current through the slower IGBT device 12 to determine the length of the turn-off transition time interval and compares it with a reference signal. The controller 21 then modulates the reference signals in accordance with the environmental conditions present at the hybrid switch 10 (e.g., temperature) and with the load (e.g., current).

For example, as shown in FIGS. 3A and 3B, the controller 21 controls the Gate Drive for the gate driver output stage 50b for the IGBT and receives various sensed inputs from sensors 48b, 68b, 66b, 56b, 58b, 60b and 62b, to help the controller 21 determine (optionally in conjunction with additional information, such as device data 15) an appropriate gate drive signal 2 (52b). The controller 21 receives data from the sensor inputs at least periodically. Advantageously, the controller 21 receives data from the sensor inputs substantially continuously, so that the controller 21 can rapidly and dynamically modify operation of the hybrid switch 10 with adaptive gate driver, via the control signal it provides to the controllable semiconductor 102.

Each semiconductor device (i.e., MOSFET 12 and IGBT 14) is in operable communication with output signals 56 from the corresponding temperature sensors 48, voltage sensors 58, 60, and current sensors 62. In addition, the MOSFET 12 and the IGBT 14 each include a respective current sense connection 64 in operable communication with a corresponding sense resistor 68. The hybrid switch 10 also includes an isolated bias power supply 23 that provides $V_{bias}$ 54a, 54b, 54c), a regulator and filter 18, input and output signals interface (including status signal interface 20 and data and signal interface 22), output stages 50a, 50b, for the gate drive circuit, and a Digital Signal Processor (DSP) 16 with nonvolatile memory 17, digital controller 21, and temperature sensors 56. The digital controller 21 of this exemplary embodiment comprises Analog to Digital Converters (ADC) 26a-26h, Digital, Adder/Subtractors (DAS) 25a-25d, Digital Control Law blocks (DCL) 28a, 28b, Digital Pulse Width Modulators (DPWM) 19 and Time to Digital Converters (TDC) 24a, 24b. In a further embodiment of the invention, the DPWM 19 is disposed external to the DSP block 16.

The inner control loops (i.e., inner loop feedback voltage 38 and inner loop feedback current 42) are optional and not required for all embodiments. In one embodiment, these inner control loops 38 and 42 help the main closed loop (i.e., the loops that surround each of the inner control loops 38 and 42) to generate the digital signal $\Delta T_1$ and $\Delta T_2$. In addition, in at least one advantageous embodiment of the invention the DCL uses hysteretic control. As those of skill in the art will appreciate, other versions of the hybrid switch 10 implementing the hybrid switch controller 21 are also possible.

The time to digital converter (TDC) refers to converting time intervals in the range of 1 nanosecond, down to the picosecond range, to a digital signal, where the output of the TDC corresponds to a measurement of the time of arrival of a pulse (a TDC also can measure the time between a start pulse and a stop pulse). This is opposite to a delay generator, which effectively is a digital to time converter. A typical delay generator gets a start pulse at its inputs, then counts down and outputs a stop pulse.

The Digital Adder/Subtractor 1 (DAS1) of FIG. 3B receives three feedback signals from DSP 16: a default voltage reference 36 for pulsewidth 1 (PW1), a temperature adjustment 34 for PW1, and a voltage adjustment 32 for PW1, each of which is converted to a corresponding digital signal (e.g., via TDC1 24a, ADC1 26a, and ADC2 26b, respectively). The ADC3 26c receives the feedback voltage for PW1 30, converts it to a corresponding digital signal, and provides it to DAS2 25b, which adds it to the output of DAS1, then provides it to DCL1 28a. DCL1 28a, in one embodiment, provides this to the DPWM 19 of DSP 16 as digital signal $\Delta T1$ 40. Optionally, in another embodiment, if the optional inner loop feedback voltage 38 is used, the inner loop feedback voltage 38 is converted to a digital signal in 26d and combined in the DCL 28a, e.g., via another digital adder, with the output of DAS2 25b, then this output is provided to the DPWM 19 of DSP 16 as digital signal $\Delta T1$ 40. The output of DPWM 19 is output to the gate driver output stage 50b for the IGBT 14.

Note that, in generally should not be necessary to have to modulate the pulsewidth of the MOSFET 12 (e.g., by providing an output of a DPWM as an input to the gate driver output stage 50A of the MOSFET 12). The faster switch (the MOSFET 12) has to operate through the complete pulse width applied to the hybrid switch 12 regardless of any delays that benefit only the slower device (IGBT 14). Of course, when the IGBT 14 turns on, the MOSFET 12 carries only a small fraction of the current. If the IGBT 14 is damaged or about to be damaged, in one embodiment of the invention, the method can turn off the IGBT 14 and keep the power converter operating with the MOSFET 12 in either of the three modes: (a) for a limited time, (b) at reduced power or (c) for a limited time and at reduced power (as discussed further herein in connection with FIG. 6). Notably, the full pulse width comes from the higher level unit (switching control layer, e.g., as shown in FIG. 15) and all such requests for changes in power level should go there (to be relayed to another higher layer e.g. application or system control; see the attached prior art block diagram of FIG. 15 for terminology).

The controller 21 (and DSP 16) also receives device data 15B and command signals 15B (e.g., from a switching control layer in a higher level control assembly, as in FIG. 15) via the data and signal interface 22. These command signals 15B, as well as use of the various sensed signals in FIG. 3B to control operation of MOSFET 12 and IGBT 14, via the methods of the invention, are described more fully in connection with FIGS. 4-11 herein. In addition, the DSP 16 receives sensed information from or associated with the MOSFET 12 and the IGBT 14. The gate driver output stage 50a for the MOSFET 12 receives a bias voltage $V_{bias}$ and produces gate drive signal 1 (52a). Similarly, the gate driver output stage 50b for the IGBT 14 receives $V_{bias}$ 54b and produces gate drive signal 2 (52b).

Figure 4:
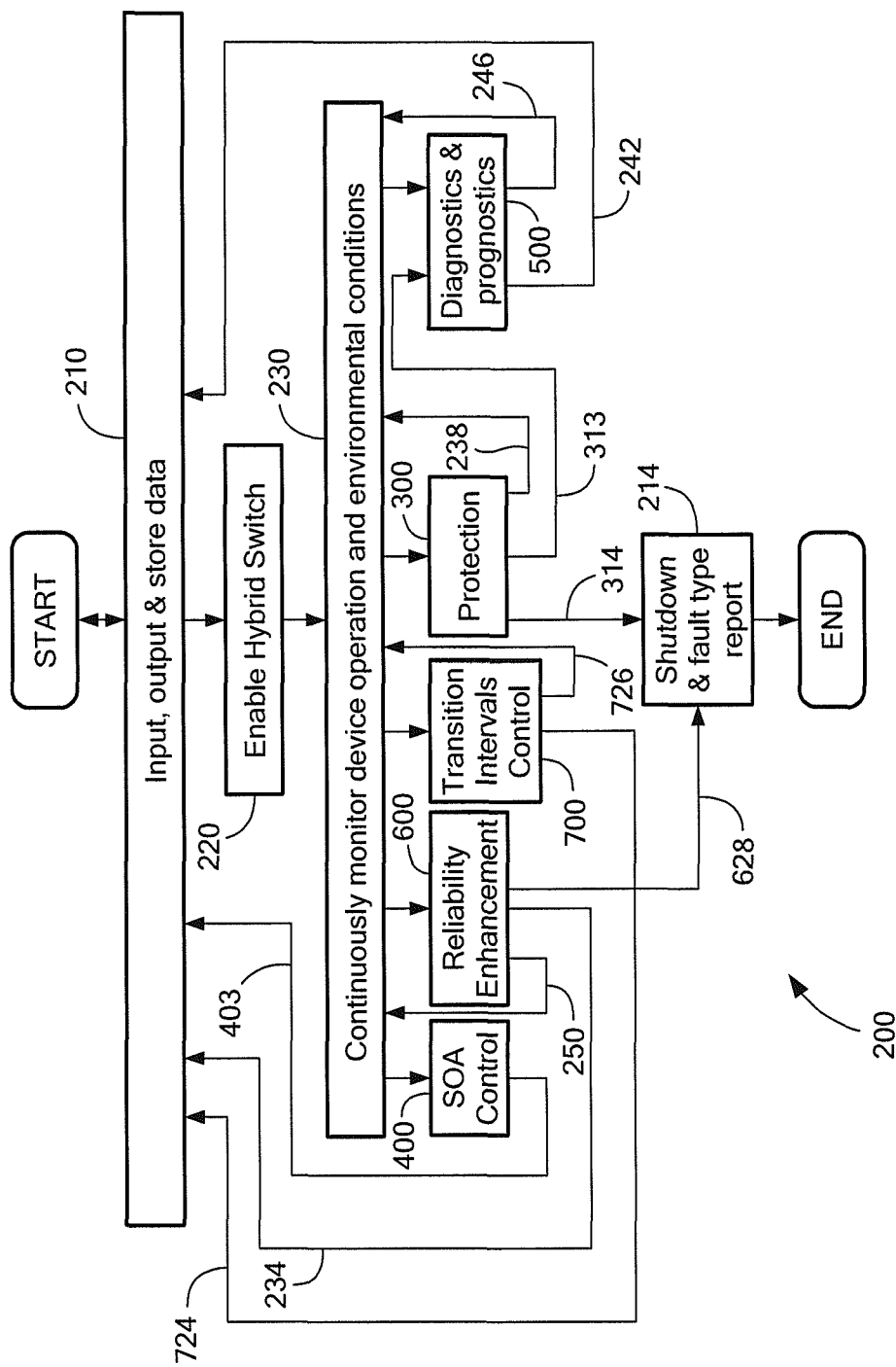
FIG. 4 is a flowchart of an exemplary top-level control method for a hybrid switch, in accordance with one embodiment of the invention.
Figure 5:
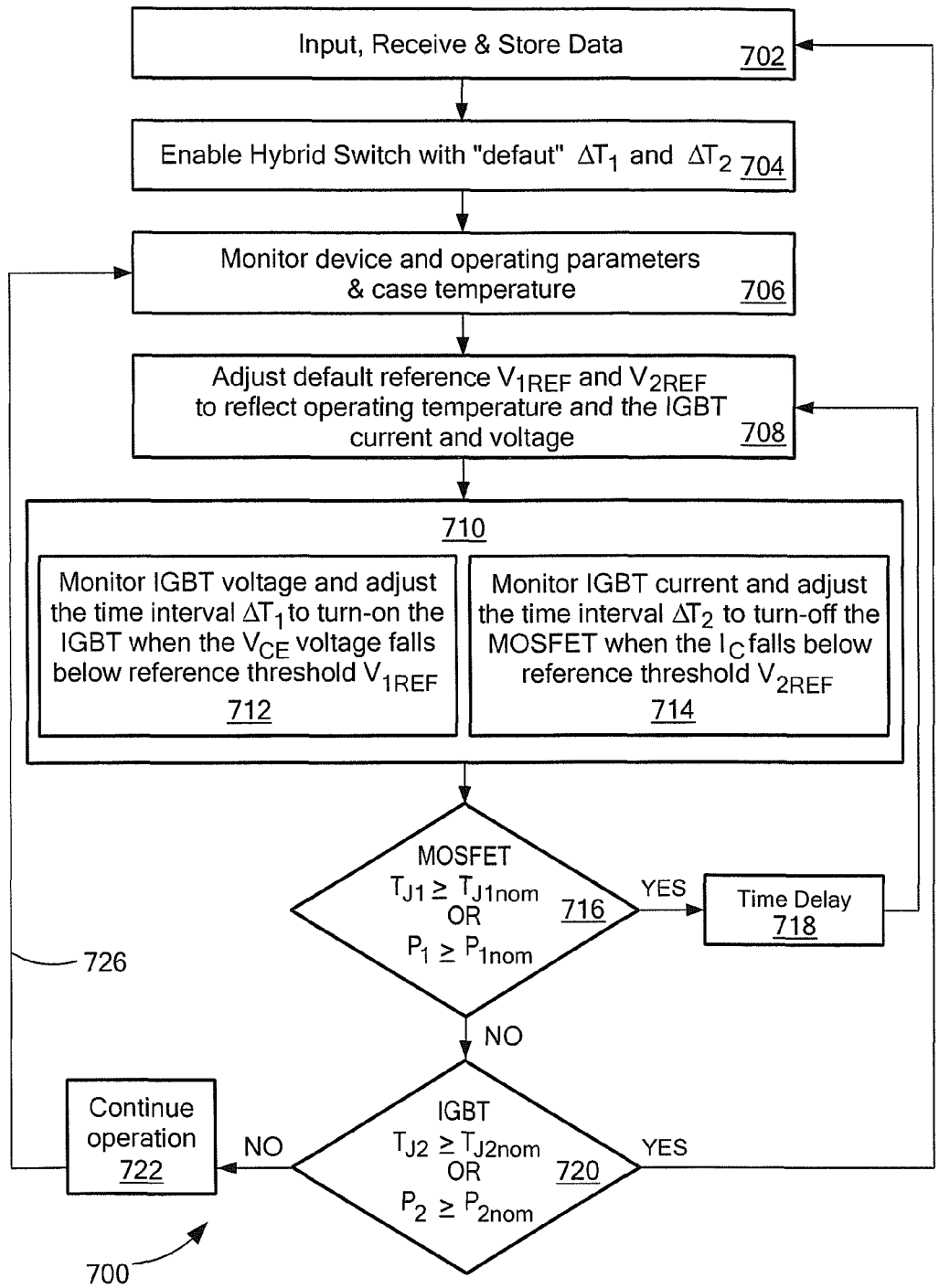
FIG. 5 is a flowchart of an exemplary adaptive control method for transition intervals, in accordance with one embodiment of the invention.

FIG. 4 is a flowchart of an exemplary top-level control method 200 for a hybrid switch 10 (e.g., the hybrid switch 10 of FIGS. 3A and 3B), in accordance with one embodiment of the invention, and FIG. 5 is a flowchart of an exemplary adaptive control method 700 for transition intervals, in accordance with one embodiment of the invention. The method 200 of FIG. 4 adapts protection, diagnostics and Safe Operating Area (SOA) sub-methods developed for the Integrated Smart Power Switch (ISPS) (described in the aforementioned and incorporated by reference '201 and '967 patents) for the new control methods for the hybrid switch 10. New features include (but are not limited to) a method for regulating the transition time intervals $\Delta T_1$ and $\Delta T_2$ using the closed-loop controller 21 (FIGS. 3A and 3B) as well as hardware architecture for individually controlling the length of transition intervals. The top-level control method 200 of FIG. 4 implements adaptive control of the hybrid switch 10, and correlates the length of transition time intervals (FIG. 1) with the power dissipation of the faster switch (i.e., the MOSFET 12 in FIG. 3B). As those of skill in the art will appreciate, in an embodiment where the MOSFET 12 and IGBT 14 are made from the same material (e.g., silicon), the MOSFET 12 generally will be faster than the IGBT 14. As will also be appreciated by those of skill in the art, it may be possible in at least some embodiments to achieve differing speeds with the MOSFET 12 and IGBT 14 by mixing technologies and/or using different materials (e.g., a silicon carbide IGBT 14 and a silicon MOSFET 12)

Figure 7:
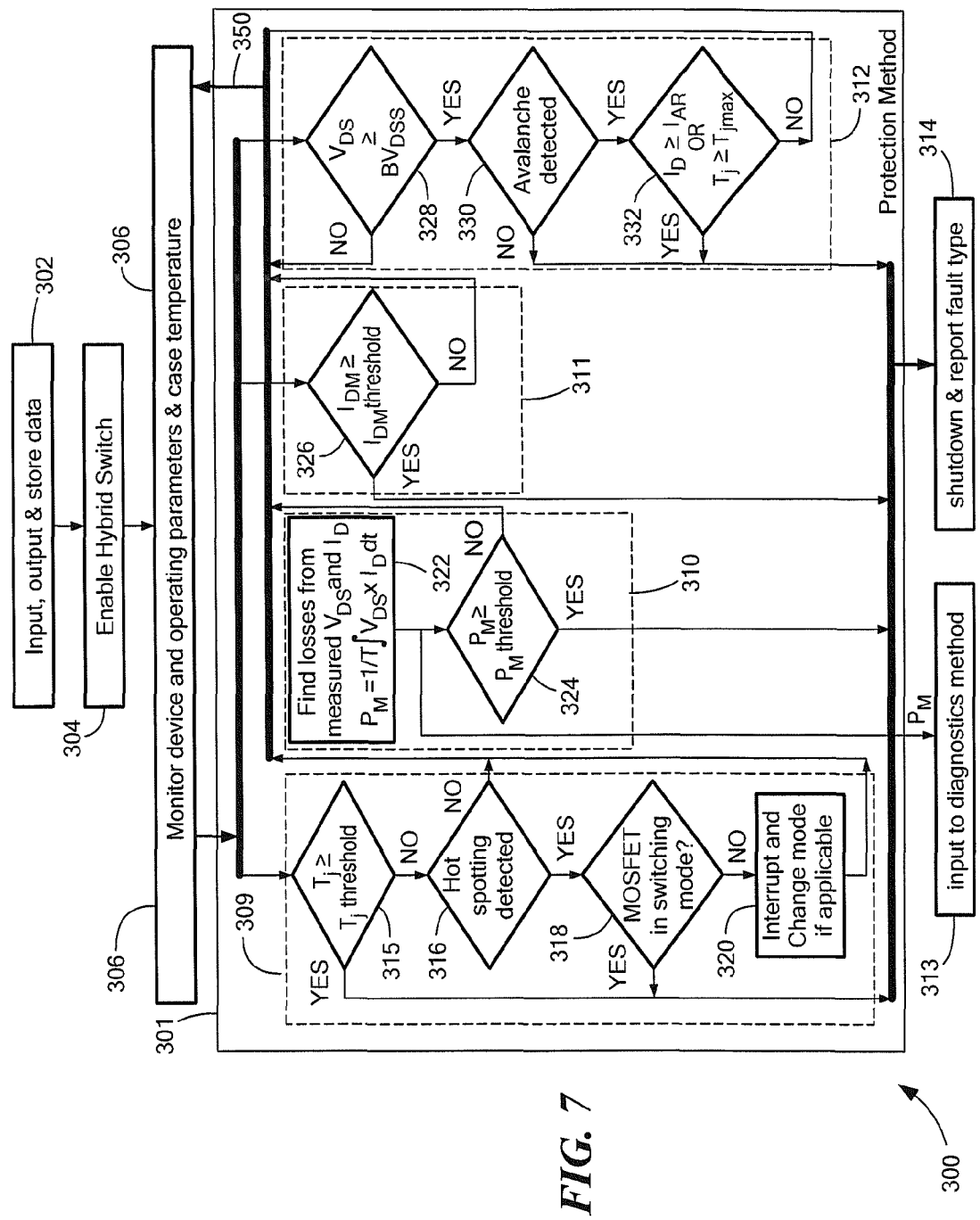
FIG. 7 is a flowchart of an exemplary ISPS protection method, in accordance with one embodiment of the invention.
Figure 8:
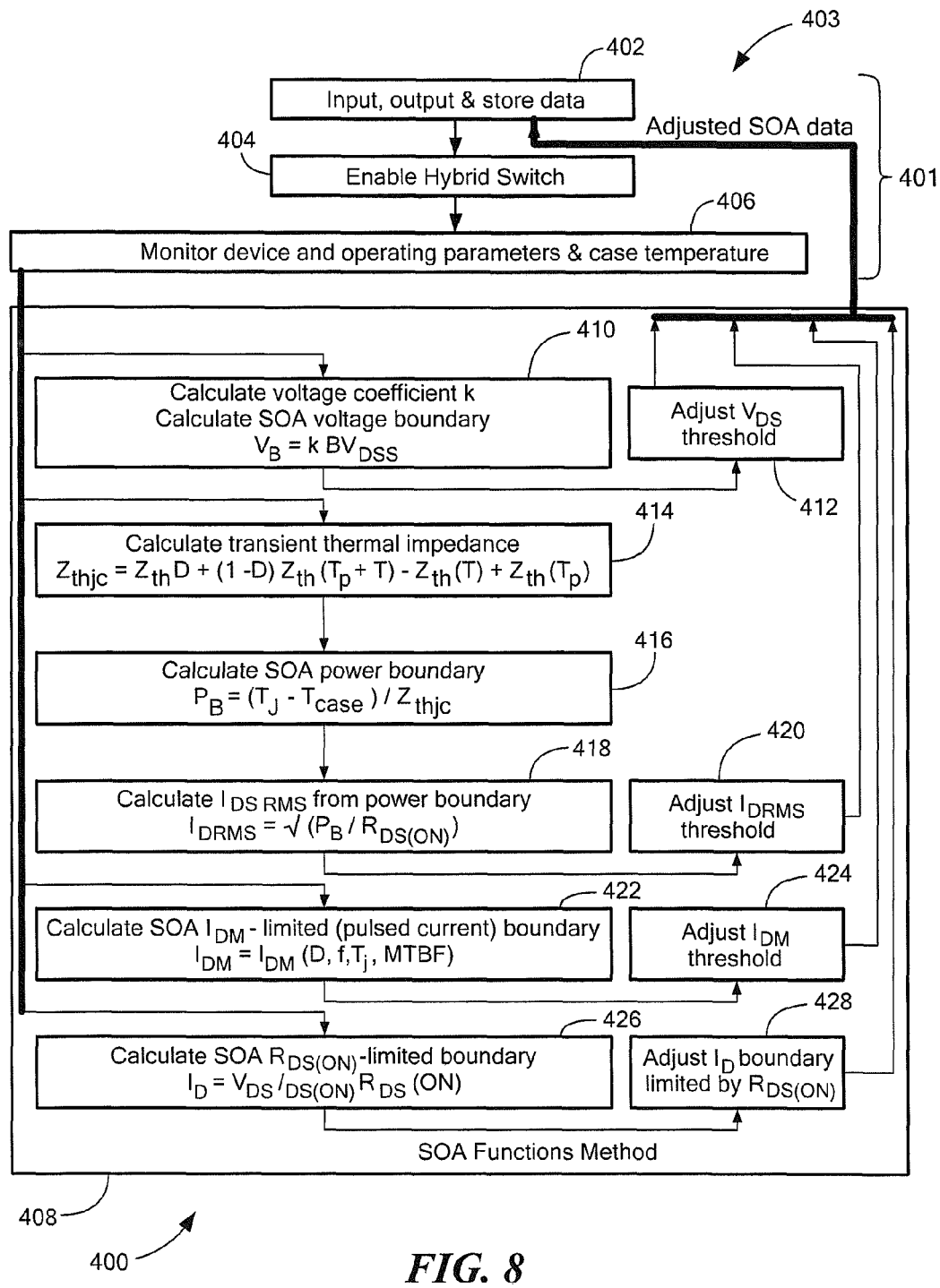
FIG. 8 is a flowchart of an exemplary safe operating area (SOA) protection method, in accordance with one embodiment of the invention.
Figure 11:
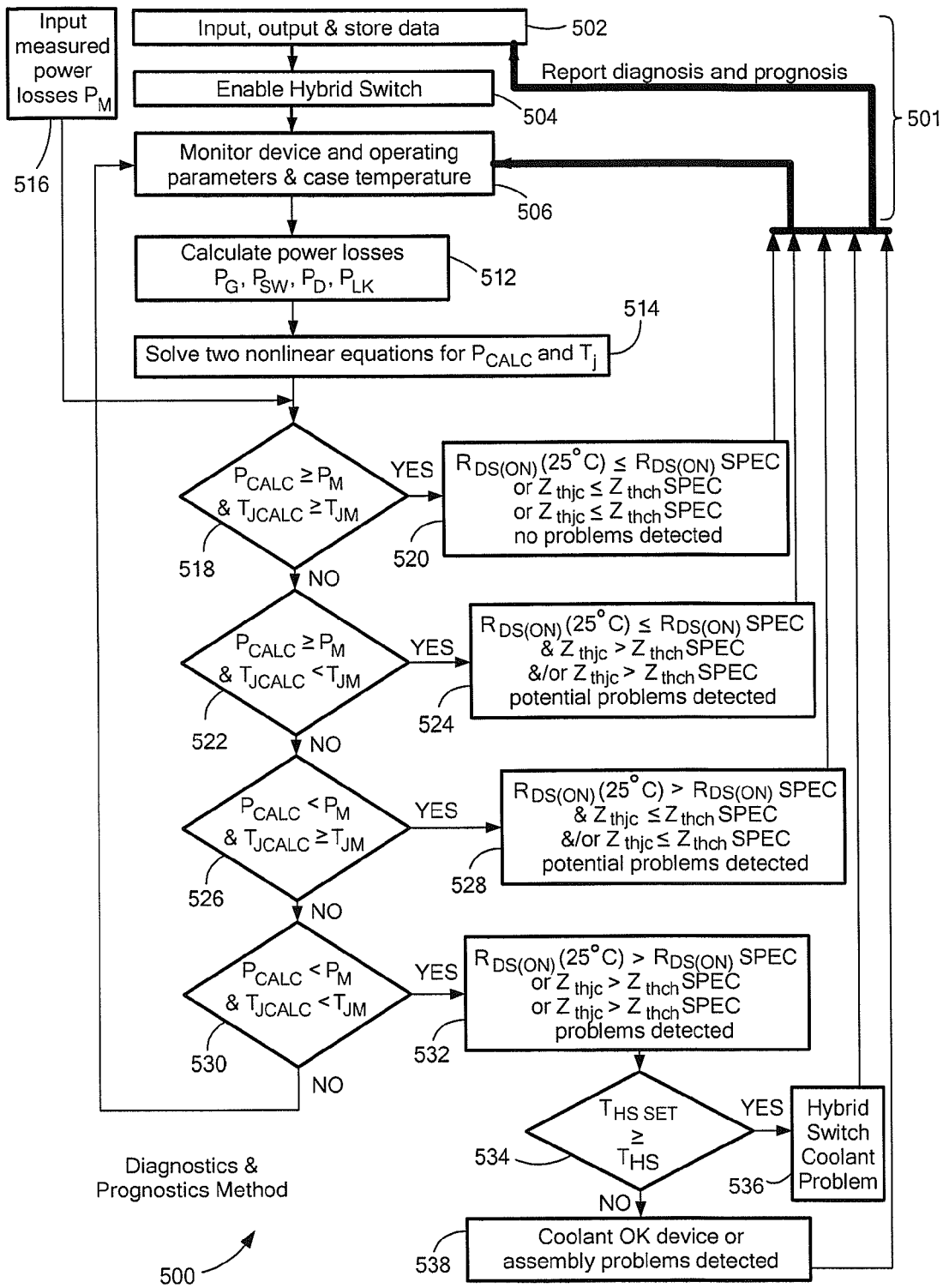
FIG. 11 is a flowchart of exemplary diagnostics and prognostics method, in accordance with one embodiment of the invention.

Referring now to FIGS. 3A, 3B and 4, device data 15B, is received at the controller 21 (block 210) and parameters of the devices being monitored, such as voltages, currents, speeds, etc., can be output, e.g., to the common monitoring block available to all sub-methods (block 210 in FIG. 4), and also block 306 of FIG. 7, block 406 of FIG. 8, and block 506 of FIG. 11), as well as to higher-level control layers. The controller 21 can receive device data 15B in many different ways. For example, the device data 15B can be manually inputted to the controller 21 by a user or other entity; the controller can access device data 15B stored elsewhere (such as on a remote device); the controller 21 can be initialized upon its power-up to be loaded with device data 15B, higher level control layers can send device data 15B to the controller 21, etc. Depending on the application, the controller 21 can receive device data 15B far in advance of the other blocks in this method. Also, in block 210, the device data 15B optionally can be stored in the hybrid switch 21, such as in the controller 21's memory (e.g., nonvolatile memory 17), if the controller 21 has on-board memory. The controller 21 alternately can access externally stored device data 15B, or can request device data 15B (e.g., from higher level control layer or from another entity having access to the device data 15B), whenever the controller 21 needs it.

The hybrid switch 10 is enabled (block 220). As an example, for the hybrid switch 10 of FIGS. 3A and 3B, this is accomplished by the controller 21 providing the hybrid switch 10 power device with a signal sufficient to enable each of the MOSFET 12 and IGBT 14, e.g., by providing a gate drive signal from the gate driver output stages 50a (for MOSFET), 50b (for IGBT) sufficient to drive the MOSFET 14 into a switching mode and the IGBT 14 into a switching mode.

Operation of the hybrid switch 10 is monitored (block 230). This monitoring occurs at least periodically, and, advantageously, it occurs substantially continuously. Monitoring operation includes monitoring one or more of the following device and/or operational parameters: die temperature, case temperature, drain voltage, gate voltage, peak drain current, root-mean-square (RMS) drain current, average drain current, gate current, junction temperature ($T_J$), switching frequency, and duty cycle. In addition, the parameters being monitored can vary depending on the particular control sub-method (i.e., the SOA control sub-method 400, the Reliability Enhancement sub-method 600, the Transition Intervals Control-method 700, the Protection sub-method 300, and the Diagnostics and Prognostics sub-method 500) being run. In at least one embodiment, the monitoring includes monitoring of all parameters required for all control sub-methods. For example, other operational parameters that can be monitored include (but are not limited to) environmental parameters or conditions, such as environmental information (e.g., a temperature, a flow of coolant, a moisture level, and/or current drawn by an external load) and mechanical parameters or conditions, such as mechanical information (e.g., stress, strain, force, movement, vibration, acceleration, and/or shock). Note, also, as FIG. 4 shows, the feedback from the sub-methods is used both as part of the overall method of FIG. 4 and is further by each sub-method.

For example, in the monitoring block 230, for the Transition Intervals Control sub-method 700 (see FIG. 5, described further herein), the parameters being monitored include (but are not limited to): die and case temperatures for both the MOSFET 12 and IGBT 14, collector, drain and gate voltages, peak, RMS, and average drain and collector currents, gate currents, switching frequency, and duty cycle. The particular parameters being monitored are discussed more particularly in connection with the description herein of the corresponding sub-method.

After block 230, the control method 200's processes are split into five methods, each of which may be executed (but is not required to be executed) substantially simultaneously. The five methods also can be executed independently of each other, sequentially, etc. Furthermore, any one of the five methods can be executed without requiring that any of the other methods be executed. Block 400 represents the safe operating area (SOA) sub-method 400, which is explained further herein in connection with FIG. 8. Block 500 represents the Reliability Enhancement sub-method 600, which is explained further herein in connection with FIG. 6. Block 700 represents the Transition Intervals Control sub-method 700, which is explained further herein in connection with FIG. 5. Block 300 represents the Protection sub-method 300, which is explained further herein in connection with FIG. 7. Block 500 presents the Diagnostics and Prognostics sub-method 500 which is explained further herein in connection with FIG. 11.

FIG. 4 also illustrates how the sub methods 300-700 provide continuous feedback of information and data to the "input output and store data" block 201, the "continuously monitor device operation and environmental conditions" block 230, and/or to each other. All of the sub-methods except the Protection sub-method 300 provide one or more feedback signals to block 210, input, output, and store data, so that, advantageously, in at least one embodiment, all of the sub-methods continuously and dynamically benefit from the information detected and operational adjustments resulting from the other sub-methods (e.g., The SOA sub-method 400 provides SOA feedback 403, the Reliability sub-method 600 provides reliability feedback 234, the Transition Intervals Control sub-method 700 provides Transitions feedback 724, and the Diagnostics & Prognostics sub-method 500 provides Diagnostics/Prognostics feedback 242). Note that although FIG. 4 illustrates only a single line for all paths and interconnects between the various sub-methods and each other and other blocks in FIG. 4, in some cases a single line actually is representing multiple different paths from sub-method or block to the next sub-method or block, as will be appreciated by those of skill in the art.

Still referring to FIG. 4, in addition, all of the sub-methods except the SOA control sub-method 400 either provide direct feedback to block 230, continuously monitor device operation and environmental conditions, or functionally these sub-methods have a return path to block 230, which effectively is a common interface block for all of the sub methods. Similarly, as FIG. 4 shows, the SOA control sub-method 400, the Reliability Enhancement Sub-Method 600, the Transition Intervals Control Sub-Method 700, and the Diagnostics and Prognostics Sub-Method 500 all have a return path to block 210, which effectively also is a common interface path for all of the sub methods, as well as for the methods of FIGS. 5-9 and 11. The Reliability Enhancement sub-method 600 has a reliability return path 250 to block 230. The Transition Intervals Control sub-method 600 has a Transitions return path 726 to block 230. The Protection sub-method 300 has a Protection return path 238 to block 230 and also provides of information to the Diagnostics & Prognostics sub-method 500 via Protection Output path 313. The Diagnostics & Prognostics sub-method 500 has a return path 246 to block 230. As will be explained further herein, the SOA curves are derived as described in connection with FIGS. 8-10, and the SOA curves are provided to the reliability methods of FIGS. 4-6. In the event of abnormal operation of one device (e.g., one of the MOSFET 12 and IGBT 14) comprising the hybrid switch 10, the reliability method (e.g., FIG. 6) requests the maximum SOA for the "still good" device from the SOA methods/graphs of FIGS. 9-11, Two of the sub-methods, the Reliability Enhancement sub-method 700 and the Protection sub-method 300, have as a possible output a shutdown of the hybrid switch 20 (e.g., via Reliability shutdown path 628 and/or Protection shutdown path 260).

FIG. 5 is a flowchart of an exemplary adaptive control method 700 for transition intervals, in accordance with one embodiment of the invention. The method of FIG. 5 is applicable at least to the circuit of FIGS. 3A and 3B, as well as the exemplary circuits of FIGS. 12-15, described further herein, as will be recognized by one of skill in the art. In FIG. 5, the adaptive control method 700 uses closed-loop feedback, which provides better device utilization and further improved efficiency compared to the feed-forward method described above. In addition, in FIG. 5, the following description of the method applies to hysteretic control law implementation (note that the control law effectively comes from the command signals 15B, effectively being provided to the hybrid switch 10 by another system level layer, as shown in FIG. 15). The adaptive control method 700 can be adapted for the protection of virtually any type of hybrid power device, as those of skill in the art will appreciate.

For example, as one of skill in the art will appreciate, the hybrid switch 10 of various embodiments of the invention can be implemented using different types of pairs of devices, so long as they meet the aforementioned switching and power-handling requirements. For example, in one embodiment, the hybrid switch 10 is implemented to be able to use a higher power level than the exemplary embodiment of FIG. 3B, and uses an IGBT as a "faster, lower power handling" switch (i.e., in the place of MOSFET 12 in FIG. 3B and in place of the MOSFET's functions in the methods of FIGS. 4-8 and 11), and a thyristor as a "slower, higher power handling" switch (i.e., in the place of IGBT 14 in FIG. 3B an in place of the IGBT's functions in the methods of FIGS. 4-8 and 11). Other combinations are, of course, usable, as one of skill in the art will appreciate.

The adaptive control method 700 can be implemented as part of the control method 200 of FIG. 4, or can be implemented as a stand-alone method. If the adaptive control method 700 of FIG. 5 is implemented as part of the control method 200 of FIG. 5, then block 702 (input, receive, and store data) is accomplished via block 210 of FIG. 4; likewise, block 704 of FIG. 5 (Enable hybrid switch 10 with "default" $\Delta T_1$ and $\Delta T_2$, e.g. a predetermined default $\Delta T_1$ and $\Delta T_2$); and, similarly, block 706 of FIG. 6 (Monitor device and operating parameters & case temperature) is accomplished via block 220 of FIG. 4, such that the adaptive control method 700 for transition intervals method 700 begins after block 706 in FIG. 5.

Else, if the adaptive control method 700 is implemented as a stand-alone method, blocks 702, 704, and 706 are executed. The "Input and Store Data" functions performed in block 302 of FIG. 5 are substantially the same as the "Input, Output, and Store Data" functions of block 210 of FIG. 4, and the description provided above for block 210 is applicable to block 702.

In particular, at block 702, the step includes Input and store device data in the on-board memory. The data include initial ("default") time intervals $\Delta T_1$ and $\Delta T_2$, breakdown drain to source voltage $BV_{DSS}$ and breakdown collector to emitter voltage $BV_{CES}$, rated drain to source voltage $V_{DSS}$ and rated collector to emitter voltage $V_{CES}$, maximum single pulse drain current $I_{DM}$ and maximum single pulse collector current $I_{CM}$, continuous drain current $I_D$ and continuous collector current $I_C$, MOSFET avalanche current $I_{AR}$, IGBT single pulse avalanche energy $E_{AS}$ and their respective protection thresholds, on state MOSFET resistance at 25° C. $R_{DS(on)}$ (25° C.), normalized on state resistance $R_{DS(ON)}$ versus temperature and IGBT collector-emitter on voltage $V_{CE(on)}$. Also, for both devices, input and store "default" Forward Biased Safe Operating Area (FBSOA) and Reverse Biased Safe Operating Area (RBSOA) for a single pulse at $T_j=25°$ C., junction-to-case transient thermal impedance curves for normal and avalanche modes, heat sink to case thermal impedance $Z_{thhc}$, junction to case thermal impedance $Z_{thjc}$, heat sink temperature $T_{HS}$ as a function of the dissipated power $T_{HS(PM)}$, junction temperature $T_J$ threshold, reverse recovery charge of the integral body diode $Q_{rr}$ and its reverse recovery time $t_{rr}$. As those of skill in the art will appreciate, for devices such as the IGBT 14, manufacturers use a variety of SOA terms e.g. Switching Safe Operating Area (SSOA) for the devices referenced herein.

In block 704, the "enable hybrid switch 10" functions of block 704 of FIG. 5 are substantially the same as the "Enable hybrid switch" functions of block 220 of FIG. 4, and the description provided above for block 220 is applicable to block 704. In particular, in this block, to enable the hybrid switch 10, start with initial value for the turn-on delay time $\Delta T_1$ and the turn-off advance time $\Delta T_2$ based on the maximum values from the stored device data.

The "Monitor device and operating parameters and case temperature" functions of block 706 of FIG. 5 are substantially the same as the "Continuously Monitor Device Operation and Environmental Conditions" functions of block 230 of FIG. 4, and the description provided above for block 230 is applicable to block 706. In particular, in this block 706, continuously monitor die and case temperatures for both devices (i.e., both the MOSFET 12 and the IGBT 14), collector, drain and gate voltages, peak, RMS, and average drain and collector currents, gate currents, switching frequency, and duty cycle.

In block 708, the controller 21 adjusts the references $V_{1REF}$ and $V_{2REF}$ to reflect operating temperature (sensed by temp sensors 48A, 48B) and the IGBT 14 current (i.e., the emitter current, because it reflects the load) and voltage. Note that both $V_{1REF}$ and $V_{2REF}$ are digital signals (as opposed to actual analog voltage and current they represent), as will be appreciated by one of skill in the art. Also, both feedback signals ($V_{CE}$ and Ic) are digital variables as well. The default values for both references are derived from the device data sheet (e.g., device data 15B) and entered into the memory of the controller 21. During operation, the default values of $V_{1REF}$ and $V_{2REF}$ are adjusted to reflect changing conditions (hence the digital summing blocks). In addition, while converter topologies with Zero-Voltage Switching (ZVS) property have negligible turn-on switching losses substantially independent of current and temperature, most silicon IGBTs in hard-switched topologies exhibit an increase in switching losses (both turn-on and turn-off) at higher collector currents. To account for this effect, both references $V_{1REF}$ and $V_{2REF}$ should be reduced to provide a longer transition time interval for the IGBT. Similarly, because for most silicon IGBT switching losses go up with temperature, both references $V_{1REF}$ and $V_{2REF}$ shall be adjusted down when the device temperature is increased. While this procedure fully applies for the above-referenced IGBT part number APT80GA90LD40, specific device data should be consulted to deter mine the direction (up or down) of the references adjustment. Similarly, if it is desired to increase MTBF of the IGBT, both references $V_{1REF}$ and $V_{2REF}$ shall be reduced to reduce its switching losses.

In block 710, monitor IGBT 14 voltage and adjust the time interval $\Delta T_1$ 40 to turn-on the IGBT 14 when the $V_{CE}$ voltage falls below reference threshold $V_{1REF}$. Simultaneously, in block 712, monitor IGBT 14 current and adjust the time interval $\Delta T_2$ 42 to turn-off the MOSFET when the $I_C$ falls below reference threshold $V_{2REF}$. In the embodiment of FIG. 3B, the Digital Adder/Subtractor (DAS) components (25A-25D) is performing the adjusting of the $\Delta T_1$ 40 and $\Delta T_2$ 42.

In decision block 716, based at least in part on the measurements taken in block 706 and the device data stored at block 704, if the junction temperature $T_{J1}$ of the MOSFET 12 and/or its measured power $P_{M1}$ exceed or are equal to their respective nominal-level thresholds $T_{J1nom}$ or $P_{1nom}$, the controller 21 adjusts the default references to increase the length of time intervals $\Delta T_1$ and $\Delta T_2$ and processing goes back to block 708 after a time delay 718 sufficient for settling junction temperatures. The time delay 718 can vary based on the components used, but in an exemplary embodiment it ranges from 300 to 500 ns for both turn-on and turn-off switching transitions. Else, processing continues to block 720.

In decision blocks 716 and 720, based at least in part on the measurements taken in block 706 and the device data stored at block 704, if the junction temperature $T_{J2}$ and/or measured power $P_{M2}$ of the IGBT 14 exceed their respective nominal-level thresholds $T_{J2nom}$ or $P_{2nom}$, report the difference. The reporting of the difference is reported to block 702 Input, Receive, and Store Data, and this block reports the information to a higher level controller. Optionally, a notification (e.g., to a higher level control layer, another system, a user, etc.) can be provided as part of the reporting. Else processing continues to block 722, which jumps back to block 706 to repeat the monitoring and adjusting steps of blocks 706 through 720. In this manner, the controller 21 can dynamically adjust the default references (and, effectively, dynamically reduce the length of time intervals $\Delta T_1$ and $\Delta T_2$), as required.

Figure 6:
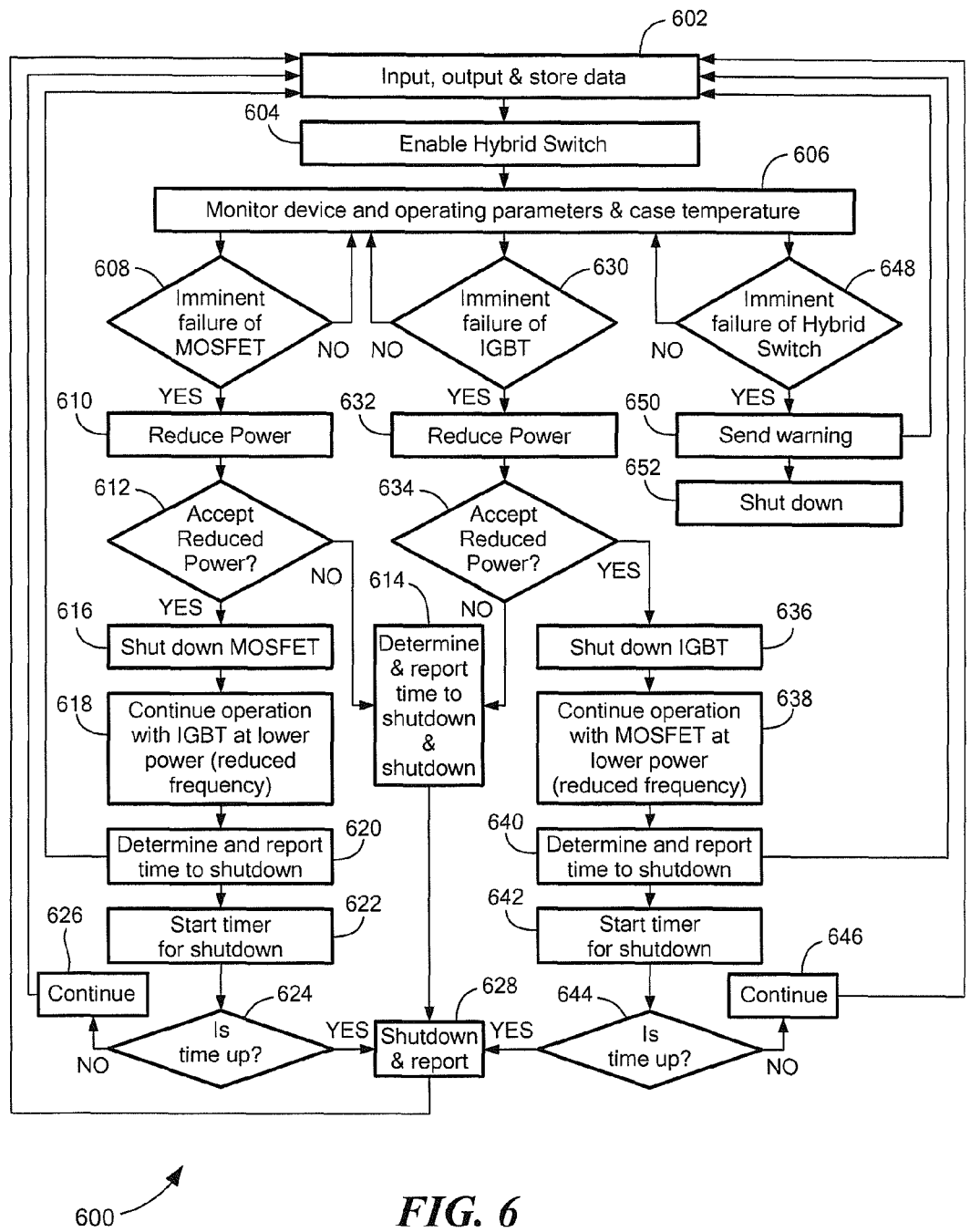
FIG. 6 is a flowchart of an exemplary reliability enhancement method, in accordance with one embodiment of the invention.

FIG. 6 is a flowchart of an exemplary reliability enhancement method 600, in accordance with one embodiment of the invention. The reliability enhancement method of FIG. 6 provides a flexible conduction pattern for the semiconductors comprising the hybrid switch 10, and is applicable at least to the circuits of FIGS. 3A and 3B. The reliability enhancement method 600 of FIG. 6 helps to enhance reliability by shifting the load to one device (of the MOSFET 12 and IGBT 14) while keeping the other device off for a short time interval or at reduced output power.

The reliability enhancement method 600 can be implemented as part of the control method 200 of FIG. 4, or can be implemented as a stand-alone method. If the reliability enhancement method 700 of FIG. 6 is implemented as part of the control method 200 of FIG. 4, then block 602 (input, receive, and store data) is accomplished via block 210 of FIG. 4; likewise, block 604 of FIG. 6 (Enable hybrid switch 10); and, similarly, block 606 of FIG. 6 (Monitor device and operating parameters & case temperature) is accomplished via block 220 of FIG. 4, such that the reliability enhancement method 600 begins after block 606 in FIG. 6.

Else, if the reliability enhancement method 600 is implemented as a stand-alone method, blocks 602, 604, and 606 are executed. The "Input and Store Data" functions performed in block 602 of FIG. 6 are substantially the same as the "Input, Output, and Store Data" functions of block 210 of FIG. 4, and the description provided above for block 210 is applicable to block 602.

In particular, at block 702, the step includes Input and store device data in the on-board memory. The data include initial ("default") time intervals $\Delta T_1$ and $\Delta T_2$, breakdown drain to source voltage $BV_{DSS}$ and breakdown collector to emitter voltage $BV_{CES}$, rated drain to source voltage $V_{DSS}$ and rated collector to emitter voltage $V_{CES}$, maximum single pulse drain current $I_{DM}$ and maximum single pulse collector current $I_{CM}$, continuous drain current $I_D$ and continuous collector current $I_C$, MOSFET avalanche current $I_{AR}$, IGBT single pulse avalanche energy $E_{AS}$ and their respective protection thresholds, on state MOSFET resistance at 25° C. $R_{DS(on)}$ (25° C.), normalized on state resistance $R_{DS(ON)}$ versus temperature and IGBT collector-emitter on voltage $V_{CE(on)}$. Also, for both devices (i.e., both the MOSFET 12 and the IGBT 14), input and store "default" Forward Biased Safe Operating Area (FBSOA) and Reverse Biased Safe Operating Area (RBSOA) for a single pulse at $T_j$=25° C., junction-to-case transient thermal impedance curves for normal and avalanche modes, heat sink to case thermal impedance $Z_{thhc}$, junction to case thermal impedance $Z_{thjc}$, heat sink temperature $T_{HS}$ as a function of the dissipated power $T_{HS(PM)}$, junction temperature $T_j$ threshold, reverse recovery charge of the integral body diode $Q_{rr}$, and its reverse recovery time $t_{rr}$.

In block 604, the "enable hybrid switch 10" functions of block 604 of FIG. 6 are substantially the same as the "Enable hybrid switch" functions of block 220 of FIG. 4, and the description provided above for block 220 is applicable to block 604. In particular, in this block, to enable the hybrid switch 10, start with initial value for the turn-on delay time $\Delta T_1$ and the turn-off advance time $\Delta T_2$ based on the maximum values from the stored device data.

The "Monitor device and operating parameters and case temperature" functions of block 606 of FIG. 6 are substantially the same as the "Continuously Monitor Device Operation and Environmental Conditions" functions of block 230 of FIG. 4, and the description provided above for block 230 is applicable to block 606. In particular, in this block 606, continuously monitor die and case temperatures for both devices (i.e., both the MOSFET 12 and the IGBT 14), collector, drain and gate voltages, peak, RMS, and average drain and collector currents, gate currents, switching frequency, and duty cycle.

Part of the data received by the Reliability Enhancement sub-method 600 from other sub-methods, at block 602, includes receiving information (e.g., a report) from the Diagnostics and Prognostics sub-method 500 indicating the condition of all controllable semiconductors comprising the hybrid switch 10. This information is continually and dynamically received during the operation of the hybrid switch (so, initially, prior to the hybrid switch 10 being enabled, the information may not be available yet). In addition, note that the hybrid switch 10 of at least some embodiments further comprises components, such as diodes, antiparallel diodes, etc., that are not controllable, so their condition is not checked or reported on. This check is indicated by three decision blocks in FIG. 6: decision block 608 (imminent failure of MOSFET 12), decision block 630 (imminent failure of IGBT 14), and decision block 648 (imminent failure of hybrid switch 20). If the result at the decision blocks 608, 630, and 648 shows that all devices are operating normally (i.e., the answer is NO at each decision block), then all processing returns to block 606. If the Diagnostics and Prognostics method 500 reports an imminent failure of either the MOSFET 12 or IGBT 14, or hybrid switch 10, then processing continues on as indicated in FIG. 6. If the Diagnostics and Prognostics method 500 reports an imminent failure of the hybrid switch 10 (block 648), meaning all power devices comprising the hybrid switch 10 are about to fail, then a shutdown warning is sent (block 650) (this warning is provided to the other sub-methods of FIG. 4 via the input, receive and store data block 210 of FIG. 4, as discussed above), and the hybrid switch 10 is shut down (block 652).

At blocks 608 (for the MOSFET) and 634 (for the IGBT), if the answer at the decision respective block is YES, then a request is sent (e.g., to a higher level control system, such as the system 5000 of FIG. 15) to reduce the output power of the MOSFET 12 (block 610) or IGBT 12 (block 632). This request can, for example, be sent from the controller 21 to whatever entity or device in which the MOSFET 12 and/or the IGBT 14 are running, such as a system application layer or control layer in another device, such as the system 5000 of FIG. 15. converter of FIG. 13.

If the request to accept reduced power is accepted (block 612 for MOSFET 12, block 634 for IGBT 13), then the method 600 effectively shuts down the malfunctioning device (either MOSFET block 616 or IGBT-block 636) and the hybrid switch 10 continues operation at reduced power with the remaining device. In one embodiment this shutdown can occur, for example, via a higher level system 5000 (FIG. 15) receiving the request to reduce power (blocks 610-612 of FIG. 6), which is output as part of the status, prognostics, and diagnostics 13 (FIG. 4) and the controller 21 receiving back a new command signal 15A (FIG. 4) that controls the signals sent to the hybrid switch 10 so as to reduce the power to the MOSFET 12. For example, in block 618, if the MOSFET 12 is shut down, the method 600 directs the IGBT 14 to continue operation at a lower power and reduced frequency (e.g., in one embodiment, via the same request sent to a higher level control layer and command signal 15A returned back from the higher level control layer, as described above). Similarly, referring again to FIG. 6, in block 638, the method 600 directs the MOSFET 12 to continue operation at a lower power and a reduced duty cycle. Generally, the method 600 reduces the power using a method directed by a higher-level control (e.g., system application layer or the converter control layer, as in the system 5000 of FIG. 15) appropriate for the remaining semiconductor (e.g. reduce duty cycle if the remaining device is the fast one (e.g., a MOSFET)) and reduce switching frequency if the remaining device is the slow one (e.g., the IGBT)).

The remaining semiconductor device (IGBT or MOSFET, e.g.) may operate at the maximum Safe Operating Area (SOA) and minimum MTBF allowed by the SOA method 400. Further, as those of skill in the art will appreciate, in certain applications (e.g., those where repair is difficult, such as space or other remote applications and/or where it is desired that the hybrid switch 10 run as long as possible), it may be advantageous for the remaining semiconductor to operate instead at a reduced SOA and increased MTBF, even if this adds stress on the faster device in the hybrid switch 10. Then, the Reliability method 600 determines and reports the time to shutdown of the hybrid switch 10 (blocks 622 and 640), where the time to shutdown is determined at least in part based on the Mean Time Between Failures (MTBF) that is associated with the reduced power operating conditions, given other information (e.g., sensed information) that is known about the given semiconductor, and other information computed by the SOA method 400 (as FIGS. 8-10 show, the maximum and minimum SOA curves have corresponding MTBF figures).

Figure 9:
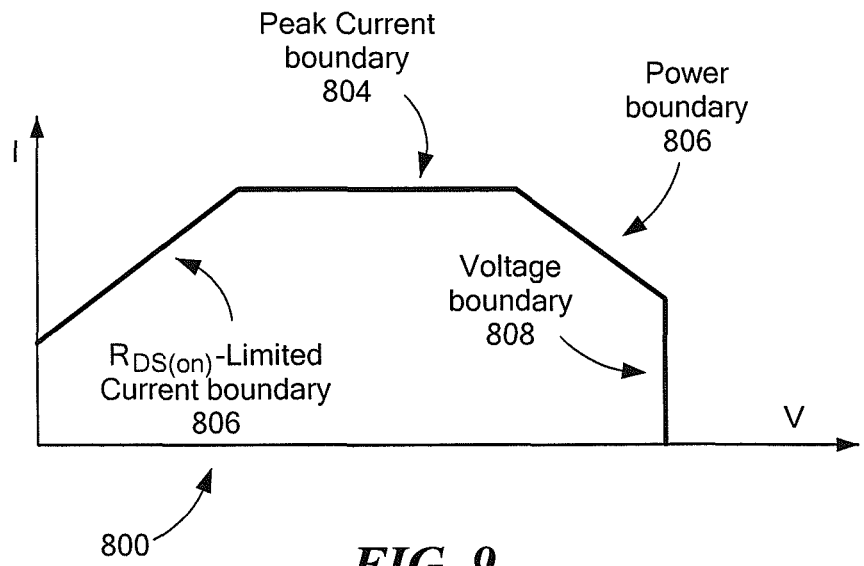
FIG. 9 is an illustrative graph showing the boundaries of the Forward Biased Safe Operating Area (FBSOA)
Figure 10:
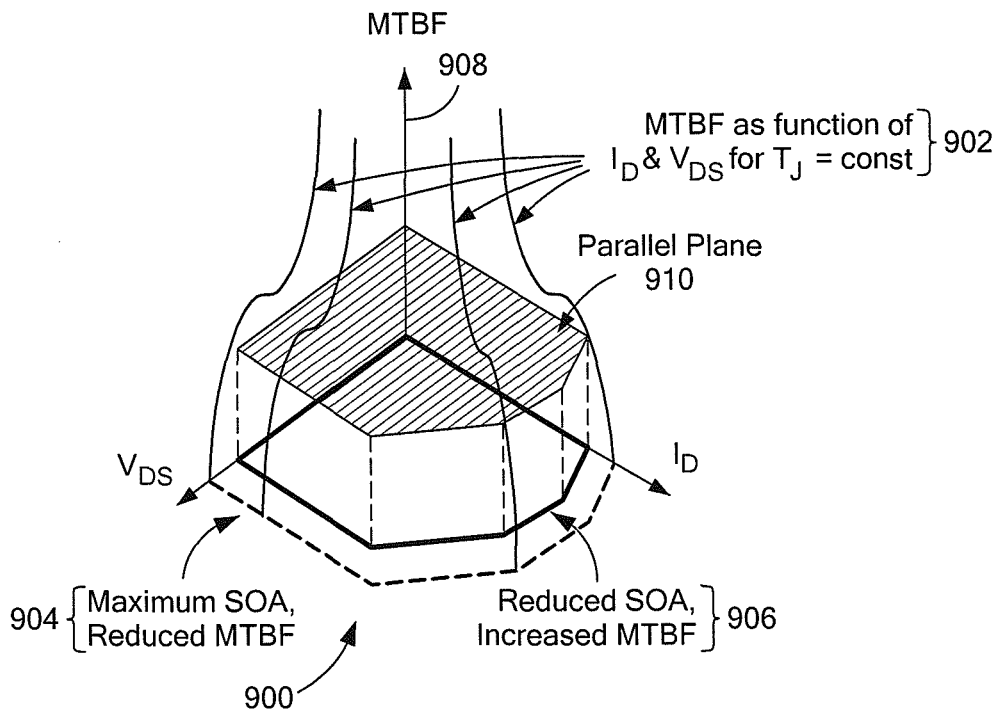
FIG. 10 is an illustrative graph showing the boundaries of the Dynamic Safe Operating Areas (DSOA)

For further understanding of the relationship between time to shutdown and MTBF, reference is now made briefly to FIG. 9 (which is a graph illustrating boundaries of an exemplary forward biased safe operating area (FBSOA), for an illustrative MOSFET device) and FIG. 10 (which is a graph illustrating a concept of a dynamic safe operating area, which was discussed previously in connection with the aforementioned, incorporated by reference '201 patent). In FIG. 9, the boundaries are provided (or can be computed) based on the device data 15 provided in block 210 (FIG. 4), (e.g., in a device data sheet). For example, because the drain to source resistance $R_{DS}$ of a MOSFET is known, the $R_{DS(on)}$-limited current boundary shown in FIG. 9 can be determined by applying increasing amounts of voltage across the drain to source and measuring how much current is flowing. There is a limit to how much current can flow regardless of increased voltage (i.e., the peak current boundary), and, further along the FBSOA boundary of FIG. 9, it can be seen that the MOSFET is also subject to a power boundary, eventually reaching a limit, shown by the voltage boundary of FIG. 9, beyond which the MOSFET not operate with the required/desired MTBF.

In FIG. 10, curves representing the function of MTBF of voltage and current for fixed junction temperature are graphed to form a three-dimensional surface (a cross section of this surface is shown in FIG. 10 as the shaded area labeled "Parallel Plane 910"). For clarity, the $R_{DS(on)}$-limited current boundary of FIG. 9 is not shown in FIG. 10. An area on the plane bounded by dotted lines in FIG. 10 represents the Maximum Safe Operating Area 904 (MSOA) that corresponds to minimum (also referred to as "reduced") MTBF. An area on the parallel plane 910 represents an Increased MTBF and reduced SOA 906. As was discussed in the aforementioned and incorporated-by-reference '201 patent, to realize the concept of a Dynamic Safe Operating Area (DSOA), the methods of FIGS. 8-11 (when considering SOA) effectively "slide" the SOA up and down the MTBF axis 908 to achieve the desired performance. Note also that although the curves for MTBF in FIG. 10 are shown only for a MOSFET, those of skill in the art will appreciate that similar curves can be generated for an IGBT. (e.g., using information in the data sheet for the IGBT, such as the data sheet for the aforementioned APT80GA90LD40 product, which data sheet is hereby incorporated by reference).

With the MOSFET 12 (or the IGBT 14) operating at Maximum SOA and Reduced MTBF 904 (FIG. 10), the graph of FIG. 10 shows that, for a given junction temperature $T_j$ (which is sensed in the circuit of FIGS. 3A and 3B), the time to shutdown of the hybrid switch 10 can be equated to be less than the MTBF for nominal operating conditions. If the higher level control (system application layer or converter control layer) did not accept reduced power (blocks 612, 634), the time to shutdown is determined (e.g., using the device data 15, sensed environmental and circuit data, and the graph of FIG. 10), (blocks 620, 640), and a timer is started to count down to shutdown (blocks 622, 642). If the shutdown time is not yet up, operation continues (blocks 626, 646). When the time is up (blocks 624 and 644), the hybrid switch 10 is shut down and status is reported (block 628).

If the request to accept reduced power (blocks 612, 634) is not accepted, then the reliability method 600 shuts down the malfunctioning device, continues operation at full power using the remaining device, and reports anticipated time to shutdown of the hybrid switch 10 (block 624).

In addition to the above-described Transition Intervals Control sub-method 700 and the Reliability Enhancement sub-method 700, the inventors have found that certain sub-methods from the aforementioned and incorporated by reference '201 and '967 patents can be incorporated into at least one embodiment of the invention. In the '201 and '967 patents, the sub-methods were described in connection with the illustrative example of control and protection of a single device (e.g., a MOSFET). However, the methods of the '201 and '967 patents fully apply to the hybrid switch comprising two or more semiconductors, including both a fast-switching semiconductor and a slow-switching semiconductor.

In one aspect, the present invention uses continuous monitoring of die temperature at more than one location to detect hot spotting and prevent device damage. When a semiconductor device such as a transistor develops current tunneling, the temperature in the center of the die exceeds temperature at its periphery. Thus, the detection of temperature difference between the center of the die and its periphery indicates the onset of current tunneling.

Referring to FIGS. 3A, and 3B, if temperature sensors 48A, 48B detect hot spotting when the MOSFET 12 and/or IGBT 14 transistor operates in the switching mode, the controller 21 will command the device to shut down. In addition, one implementation of current tunneling protection method 400 is illustrated in FIG. 7 as a part of the overall hybrid switch 10 control method 200 of FIG. 4.

The Protection method 300 of FIG. 7 can be implemented as part of the control method 200 of FIG. 4, or can be implemented as a stand-alone method. If the Protection method 700 of FIG. 7 is implemented as part of the control method 200 of FIG. 4, then block 302 (input, receive, and store data) is accomplished via block 210 of FIG. 4; likewise, block 304 of FIG. 7 (Enable hybrid switch 10); and, similarly, block 306 of FIG. 7 (Monitor device and operating parameters & case temperature) is accomplished via block 220 of FIG. 4, such that the Protection method 300 begins after block 306 in FIG. 7.

Else, if the Protection method 300 is implemented as a stand-alone method, blocks 302, 304, and 306 are executed. The "Input and Store Data" functions performed in block 302 of FIG. 7 are substantially the same as the "Input, Output, and Store Data" functions of block 210 of FIG. 4, and the description provided above for block 210 is applicable to block 302.

In particular, at block 702, the step includes Input and store device data in the on-board memory. The data include (but is not limited to) breakdown drain to source voltage $BV_{DSS}$, rated drain to source voltage $V_{DSS}$, maximum single pulse current $I_{DM}$, continuous drain current $I_D$, avalanche current $I_{AR}$, and their respective protection thresholds. Also, input and store "default" Forward Biased Safe Operating Area (FBSOA) and Reverse Biased Safe Operating Area (RBSOA) for a single pulse at $T_j=25°$ C., junction-to-case transient thermal impedance curves for normal and avalanche modes, heat sink to case thermal impedance $Z_{thhc}$, junction to case thermal impedance $Z_{thjc}$, on state resistance at 25° C. $R_{DS(on)(25° C.)}$, normalized on state resistance $R_{DS}(ON)$ versus temperature, heat sink temperature $T_{HS}$ as a function of the dissipated power $T_{HS}(P_M)$, junction temperature $T_J$ threshold, reverse recovery charge of the integral body diode $Q_{rr}$ and its reverse recovery time $t_{rr}$.

In block 304, the "enable hybrid switch 10" functions of block 304 of FIG. 7 are substantially the same as the "Enable hybrid switch" functions of block 220 of FIG. 4, and the description provided above for block 220 is applicable to block 304. In particular, in this block, to enable the hybrid switch 10, start with initial value for the turn-on delay time $\Delta T_1$ and the turn-off advance time $\Delta T_2$ based on the maximum values from the stored device data.

The "Monitor device and operating parameters and case temperature" functions of block 306 of FIG. 7 are substantially the same as the "Continuously Monitor Device Operation and Environmental Conditions" functions of block 230 of FIG. 4, and the description provided above for block 230 is applicable to block 306. In particular, in this block 306, continuously monitor die and case temperatures for both devices (i.e., both the MOSFET 12 and the IGBT 14), collector, drain and gate voltages, peak, RMS, and average drain and collector currents, gate currents, switching frequency, and duty cycle.

As shown in FIG. 7, after this step, in one embodiment, the Protection method 300 tasks are split into four optionally-concurrent sub-groups: over-temperature and current tunneling protection 309 (blocks 315-320), excessive power protection 310 (blocks 322 and 324), over-current protection 311 (block 326) and over-voltage protection 312 (blocks 328-332). However, not all of the embodiments require that all of the sub-groups 309-312 are run concurrently. In at least one embodiment, sub-groups can be run non-currently, or with two of the sub-groups concurrently and one sub-group before or after, or with each sub-group running at a different time from every other sub-group. In one embodiment, the any one or more of the sub-groups are run individually. In addition, in at least one embodiment, all though one or more of the sub-groups are run concurrently, the overlap is only partially concurrent, meaning that one subgroup is starting after another has begun running, etc., as will be appreciated by one of skill in the art.

In the over-temperature and current tunneling protection sub group 309, (blocks 315-320), the controller 21 checks (block 315) whether the junction temperature ($T_J$) in the MOSFET 12 and/or the IGBT 14 is greater than or equal to the $T_J$ threshold (as determined by the device data of block 302). If the measured $T_J$ is greater than or equal to the $T_J$ threshold, then the respective semiconductor device (either the MOSFET 12 and/or the IGBT 14) is shut down, and a notification is provided that reports the failure type (block 314). Note also that, in the steps of this method, maximum allowable losses and the peak current "branches" of the method apply to the IGBT 14 as well as well as to the MOSFET 12. Further, if a given IGBT 14 does not have an avalanche rating, then that portion of the over-temperature and current tunneling protection sub group 309 is skipped.

Continuing in the over-temperature and current tunneling protection group 309 of FIG. 7, if $T_J$ is not greater than or equal to the $T_J$ threshold (block 315), then a check is made as to whether hot spotting (also referred to as current tunneling) has been detected anywhere in any transistor (i.e., either or both of the MOSFET 12 and IGBT 14) of the hybrid switch 10. This can be done in several different ways, as those of skill in the art will appreciate. For example, the controller 21 can check for (a) variations in the current density and temperature across the hybrid switch 10 (and/or in either or both of the MOSFET 12 and the IGBT 14); (b) whether some locations of the die of the MOSFET 12 and/or the IGBT 14 of the hybrid switch 10, especially near the center of the respective dies for each device, start running with a lower transistor gate threshold voltage $V_{th}$; and/or (c) a localized increase in current density (caused by higher forward transconductance) in any part of the hybrid switch 10 (including in either or both of the MOSFET 12 and the IGBT 14). In at least one embodiment, the preferred method is to monitor temperature variations across the dies of each of the MOSFET 12 and the IGBT 14. After each transistor of the hybrid switch 10 has been checked for hot spotting (block 316), and if current tunneling is not detected, then the method returns to block 306.

If, however, current tunneling is detected (block 316) and the MOSFET 12 of the hybrid switch 10 is in the switching mode, then shut down the hybrid switch 10 unit and report failure type (block 314). If block 316 shows that hot spotting/current tunneling has been detected, a check is made to see if the operating mode can be changed (block 319). For example, if the MOSFET 12 is in linear mode, (block 318), operation of the hybrid switch 10 can be interrupted (block 320) without turning the hybrid switch 10 off (e.g. by biasing the hybrid switch 10 off, via biasing one or both of the MOSFET 12 and the IGBT off via changing the gate drive signal 52). Then, change the mode of the MOSFET 12 to another mode (block 320), e.g., switching mode, then resume operation feeding or sinking equivalent average current or power (depending on the application), and processing returns to block 306. Note that the method of block 309, in one embodiment, is limited to current tunneling in MOSFETs only. If, despite switching modes, the MOSFET is again having hot spotting and/or current tunneling problems (e.g., after switching modes from linear mode to switching mode, the method finds itself at block 318 again), then the MOSFET failure mode of FIG. 6 will be run (e.g., from block 318, the information is fed back, via feedback signal 350, to block 306 Monitor device and Operating Parameters and Case temperature). From block 306, the same information is received into the method of FIG. 6 at its block 606, and the subsequent failure mode of the MOSFET 12 should be similar to that described therein: continue operating with the IGBT 14 alone (a) for a limited time, (b) at reduced power or (c) for a limited time and at reduced power.

Referring again to FIG. 7, after mode is changed (block 320), the excessive power protection sub-group 310 is run. In the excessive power protection sub group 310, the controller 21 finds total transistor losses $P_M$ (block 322) for the MOSFET 12 and for the IGBT 14 from two measured operating parameters: for the MOSFET 12, they are drain to source voltage ($V_{DS}$) and drain current $I_D$, for the IGBT, they are collector current $I_C$ and collector-emitter voltage $V_{CE}$. This can be done in several ways, such as by integrating the product of its instantaneous voltage and current over the time interval T. If the MOSFET 12 is switching with fixed frequency, the time interval T is the period of the switching frequency. If the MOSFET 12 operates in the linear mode or switching mode with variable frequency, the power dissipation of the MOSFET 12 is found by averaging losses over a time interval that preferably includes a number of turn on and turn off events. One of skill in the art will recognize that transistor losses over time for the IGBT 14 are averaged similarly. When the losses are computed (block 322), the information is provided (block 313) to the diagnostics and prognostics method 500, which is discussed further in connection with FIG. 11. If the total loss $P_M$ exceeds the loss $P_M$ threshold (block 324), then the controller 21 shuts down the hybrid switch 10 and provides a notification (e.g., to a user or higher level control layer, as shown in FIG. 15) as to the failure/fault type (block 314). If, however, the total loss $P_M$ is less than the loss threshold, then the method jumps back to block 306.

Referring again to FIG. 7, in the over current protection sub group 311, the controller 21 checks whether the pulse current $I_{DM}$ exceeds the threshold (block 326). If it does, the controller 21 shuts down the hybrid switch 10 and reports the failure/fault type (block 314). If the pulse current $I_{DM}$ does not exceed the threshold, then the method jumps back to block 306.

For overvoltage protection, it should be noted that, for at least some embodiments of the invention, it may be feasible to provide over-voltage protection only when the hybrid switch 10 has an additional means of removing its prime power to the hybrid switch 10 or if the hybrid switch 10 has an external circuit containing transient voltage suppressors such as semiconductors, Metal Oxide Varistors (MOVs), spark gaps, or any other appropriate devices.

In the over-voltage protection sub group 312, the controller 21 checks the MOSFET 12 of the hybrid switch 10 drain to source over-voltage $V_{DS}$ (block 328) to see if it is less than the MOSFET 12 breakdown voltage $V_{DSS}$. For example, one way the controller 21 can do this is by measuring leakage current (e.g., via current sensor 66A of FIG. 3B). If the transistor voltage $V_{DS}$ is less than its breakdown voltage, $V_{DSS}$, the method goes back to block 306. If $V_{DS}$ is greater or equal than its breakdown voltage, the controller 21 checks for an avalanche condition (block 330). One way to check for this is to check whether drain to source voltage $V_{DS}$ is constant while drain current flows through the controllable semiconductor MOSFET 14. If $V_{DS}$ is not constant (and if the conditions of block 328 are satisfied) there is no avalanche condition in the MOSFET 12, and the most likely outcome is failure of the MOSFET 12. So, if no avalanche condition is detected in block 330, the controller 21 shuts down the hybrid switch 10 and reports the failure/fault type (block 314).

If, however, the controller 21 determines that the $V_{DS}$ is staying constant, substantially decaying drain current flows through the MOSFET 12, and the conditions of block 328 are met, then the MOSFET 12 is in an avalanche condition. The controller 21 then checks (block 312) whether the drain current $I_D$ is greater than or equal to the avalanche current $I_{AR}$ or whether the junction temperature $T_J$ is greater than or equal to the maximum junction temperature. $T_{J\,max}$ (block 332). If either of these conditions is met, then the MOSFET 12 has failed or is approaching failure, and the controller 21 shuts down the hybrid switch 10 and reports the failure/fault type (block 314). If neither of the conditions in block 332 is met, then the method jumps back to block 306.

In the over-voltage protection sub-group, although not specifically illustrated in FIG. 7, one of skill in the art will appreciate that similar types of checks for avalanche conditions likewise can be performed on the IGBT 14. In block 328, the controller 21 would instead check the IGBT 12 collector-emitter voltage $V_{CE}$ to see if it is less than the collector-emitter breakdown $V_{BR(CES)}$ for the IGBT 14, e.g., by measuring leakage current via current sensor 66B. If the IGBT transistor voltage $V_{CE}$ is less than its breakdown voltage, $V_{B(CES)}$, the method goes back to block 306. If $V_{CE}$ is greater or equal than its breakdown voltage, the controller 21 checks for an avalanche condition (block 330). One way to check for this is to check whether collector to emitter voltage $V_{CE}$ is constant while collector current flows through the controllable semiconductor IGBT 12. If $V_{CE}$ is not constant (and if the conditions of block 328 are satisfied) there is no avalanche condition in the IGBT 14, and the most likely outcome is failure of the IGBT 14. So, if no avalanche condition is detected in block 330, the controller 21 shuts down the IGBT 14 and reports the failure/fault type (block 314.

If, however, the controller 21 determines that the $V_{CE}$ is staying constant, substantially decaying collector current flows through the IGBT, and the conditions of block 328 are met (as applicable to the IGBT, so $V_{CE} \geq V_{BR(CES)}$), then the IGBT 14 is in an avalanche condition. The controller 21 then checks (block 312) whether the collector current $I_C$ is greater than or equal to the avalanche energy or single pulse avalanche energy $E_{AS}$ in the forward direction, or whether the junction temperature $T_J$ is greater than or equal to the maximum junction temperature. $T_{J\,max}$ (block 332). As those of skill in the art will appreciate, the avalanche current may be derived from this rating because $E_{AS} = \frac{1}{2}(L*I^2_{AR})$ where L=total equivalent inductance in series with IGBT collector. This inductance should be included in the list of parameters characterizing the hybrid switch 10. If either of these conditions is met, then the IGBT 14 has failed or is approaching failure, and the controller 21 shuts down the IGBT 14 (per FIG. 7) and reports the failure/fault type (block 314). If neither of the conditions in block 332 is met, then the method jumps back to block 306.

FIG. 8 is a flowchart of a method 400 ("SOA method") for dynamic control of safe operating area (SOA) for a power device, such as the hybrid switch 10, in accordance with one embodiment of the invention. This aspect of the invention provides a method for dynamic control of the Safe Operating Area (SOA) of the hybrid switch 10 and its controllable semiconductor devices (i.e., the MOSFET 12 and the IGBT 14). This method permits full use of the die of each of the controllable semiconductors in the hybrid switch 10 (i.e., full use of the MOSFET 12 and the IGBT 14) and also allows safely increasing current in accordance with the required reliability and junction temperature for the MOSFET 12 and the IGBT 14. In addition, by adjusting the SOA so as to prevent the hybrid switch 10 from shutting itself down, via adjustment of transistor voltage and current, such that any adjustment to the SOA to prevent it from shutting down will enables the hybrid switch to continue to operate.

The SOA Protection method 500 of FIG. 8 (described further below) enables real time control of SOA by adjusting transistor voltage and current in accordance with junction and case temperature and load characteristics. Operation of the method of FIG. 8 helps to ensure: (a) self-protection of a hybrid switch 20 under substantially all operating conditions (that is, the hybrid switch 10, via its controller 21 and the measurements made via sensors 108, can self-correct and self-adjust to maintain a safe operating area; (b) optimization of die size and reduced cost; and (c) safe increase of pulsed current in the battle short state (e.g., the SOA of the hybrid switch 10 can be increased to the level allowed by the maximum SOA) in the event of a crisis or emergency, to prevent the hybrid switch 10 from shutting itself down at a critical time—the hybrid switch 10 can be put in such a battle short state, for example, via command/control 15 (FIG. 3B)).

For example, if it is expected that there will an occasional increase in power dissipation (e.g., during start-up or operation with higher switching frequency when switching losses go up), and it is expected that the hybrid switch 10 can only work with the derated or "mid-level" SOA 906 (FIG. 10), one solution is to use a larger die that can handle higher power at the specified derating level. Using the method of FIG. 8, it is possible to slide the parallel plane (of FIG. 10) down towards higher power for the duration of the transient condition thereby achieving the goal with a smaller, less expensive die.

The SOA method 400 of FIG. 8 can be adapted for dynamically adjusting the operating parameters of virtually any type of power device, as those of skill in the art will appreciate. In addition, the SOA method 400 of FIG. 8 can be implemented as part of the control method 200 of FIG. 4, or can be implemented as a stand-alone method. If the SOA method 400 of FIG. 8 is implemented as part of the control method 200, then the blocks that are part of section 401 (which includes blocks 402, 404, 406) are actually accomplished via blocks 210-230 of FIG. 4, and the SOA method 400 begins after block 406 in FIG. 8.

Else, if the protection method 400 is implemented as a stand-alone method, blocks 402, 404, and 406 are executed. The "Input and Store Data" functions performed in block 402 of FIG. 8 are substantially the same as the "Receive (and Optionally Store) Device Data" functions of block 210 of FIG. 4, and the description provided above for block 210 is applicable to block 402. The "enable hybrid switch" functions of block 404 of FIG. 8 are substantially the same as the "Enable hybrid switch" functions of block 220 of FIG. 4, and the description provided above for block 220 is applicable to block 404. Likewise, the "Monitor device and operating parameters and case temperature" functions of block 406 of FIG. 8 are substantially the same as the "Monitor Device and Operation Parameters" functions of block 230 of FIG. 4, and the description provided above for block 230 is applicable to block 406.

Referring to FIGS. 3A, 3B, 4, and 8, the controller 21 calculates voltage coefficient k as a function of $T_J$, $I_D$, MTBF, and other applicable factors (block 410). This result is used to help calculate the forward biased safe operating areas (FBSOA) and reverse biased safe operating area (RBSOA) voltage boundary $V_B$ (block 402), as shown in Equation (1) below.

$$V_B = k B V_{DSS} \qquad \text{Eq. (1)}$$

The voltage coefficient k and the voltage boundary $V_B$ are provided to block 402 to adjust the default boundary derived from the single pulse, 25° C. SOA curves, which are part of the device data accessed in block 402.

In block 414, the controller 21 calculates junction to case transient thermal impedance $Z_{thjc}(t)$ using pulse width $T_p$, frequency, and duty cycle D, as shown in Equation (2) below:

$$Z_{thjc} = Z_{th}D + (1-D)Z_{th}(T_p+T) - Z_{th}(T) + Z_{th}(T_p) \qquad \text{Eq. (2)}$$

In block 416, the controller 21 calculates the FBSOA power boundary $P_B$ using $Z_{thjc}$, as shown in Equation (3) below $$P_B = (T_j - T_{case})/Z_{thjc} \qquad \text{Eq. (3)}$$

In block 418, the controller 21 calculates RMS drain to source current $I_{DSRMS}$ from the power boundary $P_B$ (see equation (4) below) and this information is used (block 420) to adjust the default RMS current threshold, back at step 402. Note that the preceding description is applicable for analysis of the MOSFET 12; one of skill in the art would readily be able to determine similarly applicable steps for the IGBT 14. For example, the equivalent term for IGBTs is the collector to emitter saturation voltage $V_{CES(sat)}$. Also, the average (or continuous) current applies here as opposed to the RMS current as in the case of MOSFETs. ($P = I^2_{RMS} * R_{DS(on)}$ for MOSFETs and $P = V_{CES} * I_C$ for IGBTs). Thus, the controller 21 would calculate RMS collector to emitter current $I_{CERMS}$ from the power boundary $P_B$ and this information is used (block 420) to adjust the default RMS current threshold, back at step 402. That is, for both the MOSFET 12 and the IGBT 14, the default RMS (for MOSFETs) or average (or continuous) (for IGBTs) current threshold is adjusted and fed back to the device data accessed at block 402, to dynamically adjust this aspect of the safe operating area.

$$I_{DRMS} = \sqrt{(P_B/R_{DS(on)})} \qquad \text{Eq. (4)}$$

In block 422, the controller 21 calculates the FBSOA and RBSOA pulse current ($I_{DM}$) boundary as a function of duty cycle D, switching frequency f, junction temperature $T_j$, and reliability (i.e., mean time between failures MTBF or another suitable reliability characteristic), in accordance with equation (5) below, and this information is used (block 242) to adjust default pulse current threshold $I_{DM}$, back at step 402.

$$I_{DM} = I_{DM}(D,f,T_j,\text{MTBF}) \qquad \text{Eq. (5)}$$

In block 426, the controller 21 calculates the FBSOA drain to source on-state resistance $R_{DS(on)}$-limited boundary using normalized on state resistance $R_{DS}(ON)$ as a function of junction temperature, in accordance with equation (6) below, and this data is used (block 428) to adjust the FBSOA boundary limited by $R_{DS(on)}$, back at step 402

$$I_D = V_D/R_{DS(on)}R_{DS}(ON) \qquad \text{Eq. (6)}$$

It should be understood that, although the SOA functions method 400 of FIG. 8 is discussed herein in connection with operation of a MOSFET, it is equally applicable to operation of an IGBT, as will be appreciated by one of skill in the art. For example, as one of skill in the art would appreciate, the IGBT FBSOA is different from that of a MOSFET; it has a square shape for most devices.

In a further aspect, the invention also provides a diagnostics and prognostics method that helps to self-diagnose and/or predict errors in the components of a power device, such as the hybrid switch 10. For example, this self-diagnosis and prediction permits the hybrid switch 10 to detect and/or predict defects that include (but are not limited to) die, die bonding, die attachment and device package mounting defects. The diagnostics and prognostics method provides an advance warning that may help to prevent preventing catastrophic failures and increase reliability of both the power device itself and any system in which it is installed. FIG. 11 is a flowchart of exemplary diagnostics and prognostics method 500, in accordance with one embodiment of the invention.

If the self-diagnostics and prognostics method 500 of FIG. 11 is implemented as part of the control method 200 of FIG. 9, then the blocks that are part of block 501 (which includes blocks 502, 504, 506) are actually accomplished via blocks 210-230 of FIG. 9, and the self-diagnostics and prognostics method 500 begins after block 506 in FIG. 11.

Else, if the self-diagnostics and prognostics method 500 is implemented as a stand-alone method, blocks 502, 504, and 506 are executed. The "Input, Output, and Store Data" functions performed in block 502 of FIG. 11 are substantially the same as the "Receive (and Optionally Store) Device Data" functions of block 210 of FIG. 4, and the description provided above for block 210 is applicable to block 502. The "enable hybrid switch" functions of block 504 of FIG. 11 are substantially the same as the "Enable hybrid switch" functions of block 220 of FIG. 4, and the description provided above for block 220 is applicable to block 504. Likewise, the "Monitor device and operating parameters and case temperature" functions of block 506 of FIG. 11 are substantially the same as the "Monitor Device and Operation Parameters" functions of block 230 of FIG. 4, and the description provided above for block 230 is applicable to block 506.

Referring to FIGS. 3A, 3B, 4, and 11, the controller 21 calculates power losses, including gate power dissipation $P_{GT}$, switching dissipation $P_{SW}$, integral body diode power dissipation $P_D$, and transistor leakage power dissipation $P_{LK}$. (Block 512). Each of these calculations is discussed further below. Equation (7) is used to calculate gate power dissipation $P_{GT}$:

$$P_{GT}=1/T\!\int |V_{GS}(t)||I_G(t)|dt \text{ for integration time interval from 0 to } T \quad \text{Eq. (7)}$$

For equations (7) through (12), the time interval T is defined as follows: If the MOSFET 12 is switching with fixed frequency, the time interval T is the period of the switching frequency. If the MOSFET 12 operates with variable frequency, the power dissipation of the MOSFET 12 is found by averaging losses defined in equations (7) through (12) over an operating time interval that includes a number of turn on and turn off events. Equation (8) is used to calculate switching power dissipation $P_{SW}$:

$$P_{SW}=1/T\!\int V_{DS}(t)I_D(t)dt \text{ for } V_{DS}>0, I_D>0 \text{ and integration time interval from } t_1 \text{ to } t_2 \quad \text{Eq. (8)}$$

where: $t_1$ is defined as the moment in time when $i_g>0.1\, I_{gpk}$ for positive ig and $V_{DS}<0.1 V_{DSS}$ $t_2$ is defined as the moment in time when $i_g<0.1\, I_{gpk}$ for negative ig and $I_{DS}<0.1\, V_{DSS}$ Other criteria for defining the integration time interval can be used without affecting the substance of this invention.

Equations (9) through (11) are used to calculate integral body diode power dissipation $P_D$ $$P_D = P_{D\,COND} + P_{D\,SW}(t) \quad \text{Eq. (9)}$$

$$P_{D\,COND}=1/T\!\int V_{DS}(t)I_D(t)dt \text{ for } V_{DS}<0, I_D<0 \text{ and integration time interval from 0 to } T \quad \text{Eq. (10)}$$

$$P_{D\,SW}=Q_{rr}/T\!\int V_{DS}(t)dt \text{ for integration time interval from 0 to } t_{rr} \quad \text{Eq. (11)}$$

where $Q_{rr}$ is reverse recovery charge $t_{rr}$ is reverse recovery time

Equation (12) is used to calculate leakage power dissipation $P_{LK}$ $$P_{LK}=1/T\!\int V_{DS}(t)I_D(t)dt \text{ for } V_{DS}=V_{DD}0, I_D>0 \text{ and integration time interval from 0 to } T \quad \text{Eq. (12)}$$

In block 514, the controller 21 solves two non-linear equations (Equations (13) and (14) below, respectively) for the power loss $P_{CALC}$ and junction temperature $T_{JCALC}$ using a numeric procedure similar to that described in R. Severns (Ed. in Chief), *MOSPOWER Applications Handbook*, Siliconix Inc., 1984, pp. 4-17 to 4-21, which is hereby incorporated by reference:

$$P_{CALC}=P_G+P_{SW}+P_D+P_{LK}+I_{RMS}^2 R_{DS(on)(25^\circ\,C.)}R_{DSN} \quad \text{Eq. (13)}$$

$$T_{JCALC}=T_{HS}+P_{CALC}(Z_{thhc}+Z_{thjc}) \quad \text{Eq. (14)}$$

Measured transistor power dissipation $P_M$ is accessed ($P_M$ can be determined and/or acquired in many different ways, including from protection method 300, block 313, from the protection algorithm). Calculated and measured power dissipation and junction temperature are compared in blocks 518, 522, 526, and 530. Note that blocks 518, 522, 526, and 530 can be performed in any order; the illustrated order is provided by way of example and is not limiting.

If $P_{CALC} \geq P_M$ and if $T_{JCALC} \geq T_{JM}$, (block 518) then the conditions of block 520 are presumed to exist (i.e., the on state resistance $R_{DS(on)}$ is within limits, as are the thermal impedances $Z_{thhc}$ and $Z_{thjc}$). The MOSFET 12 of the hybrid switch 10 is presumed to have no problems and the method jumps back to block 506. Optionally, the prognosis and diagnosis information also can be reported as part of the feedback to block 502.

If $P_{CALC} \geq P_M$ and & $T_{JCALC} < T_{JM}$, (block 522) the on state resistance $R_{DS(on)}$ is within limits, but the thermal interface impedance, including either $Z_{thhc}$ or $Z_{thjc}$ or both $Z_{thhc}$ and $Z_{thjc}$ exceeds specified values (block 524). Because higher thermal impedance will result in a higher junction temperature, the $R_{DS(on)}$ will increase till the device reaches thermal equilibrium. Thus, the detected condition has a transient nature and will diagnose thermal interface problem for some pulsed loads or for a fixed load during turn on. The prognosis is reduced device reliability and potential failure under high power load. The prognosis and diagnosis information can be reported as part of the feedback to block 502, and the method itself jumps back to block 506.

If $P_{CALC} < P_M$ and & $T_{JCALC} \geq T_{JM}$, (block 526) the situation described above for block 522 is reversed. With this condition, the combined thermal impedance $Z_{thhc}+Z_{thjc}$ is less than specified, but the on state resistance $R_{DS(on)}$ is higher than normal (block 528). These conditions diagnose either the die or die connections defect and the prognosis is reduced device reliability and potential failure under high current or high power load. The prognosis and diagnosis information can be reported as part of the feedback to block 502, and the method itself jumps back to block 506.

If $P_{CALC} < P_M$ and & $T_{JCALC} \leq T_{JM}$, (block 530), the MOSFET 12 of the hybrid switch 10 may have any of the defects described above, i.e. either the combined thermal impedance or on state resistance or both thermal impedance and on state resistance are higher than normal (block 532). These conditions can indicate either a die or die connections defect in the MOSFET 12. The prognosis is reduced device reliability and potential failure under either high current or high power load. The prognosis and diagnosis information can be reported as part of the feedback to block 502.

In block 534, heat sink temperature $T_{HS}$ is compared with expected temperature $T_{HS\,SET}$ determined from the function $T_{HS}(P_M)$. If the heat sink temperature is greater than expected for the measured power dissipation, a heat sink or heat sink cooling problem is reported (block 536), and the method itself jumps back to block 506. Note that blocks 534 and 536 can be performed at virtually any time after block 506, including before any of blocks 510-532 or between any of them, and showing blocks 534 and 536 performed at this point in the diagnostics and prognostics method 500 is provided by way of example and is not limiting.

In a further aspect, the invention also provides a method of calibrating installed power devices, such as the hybrid switch 10 of FIGS. 3A and 3B. This method relies at least in part on the dependence of the hybrid switch 10's power handling capability of its case to heat sink thermal impedance. That is, the design and operation of the hybrid switch 10 permits it to be calibrated when installed, based on its mounting and power handling capability.

When hybrid switches 10 are connected to loads, the system controller 21 sends a turn on pulse of predetermined width to all units. The hybrid switches 10 will be loaded for the duration of the pulse and will monitor and report their case temperature rise. The expected case temperature rise is based on the specified case to heat sink thermal impedance that is stored in the controller memory and the hybrid switch 10 power dissipation. Thus, all devices will be mapped according to their case temperature rise and, ultimately, power handling capability. Because devices with higher than expected case temperature rise might have mounting defects it also provides an opportunity to identify them for corrective maintenance.

Figure 12:
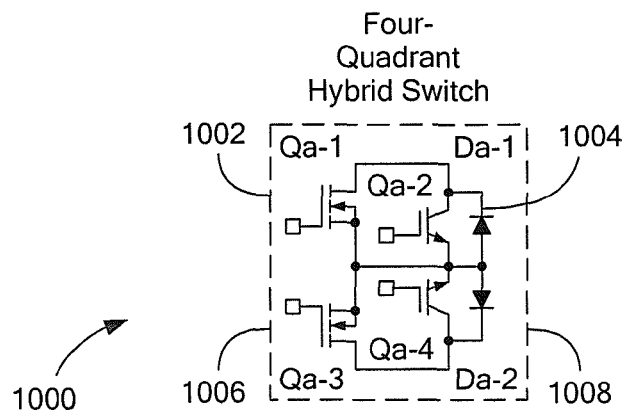
FIG. 12 is a block diagram of a four-quadrant hybrid switch with adaptive gate control, in accordance with one embodiment of the invention.
Figure 13:
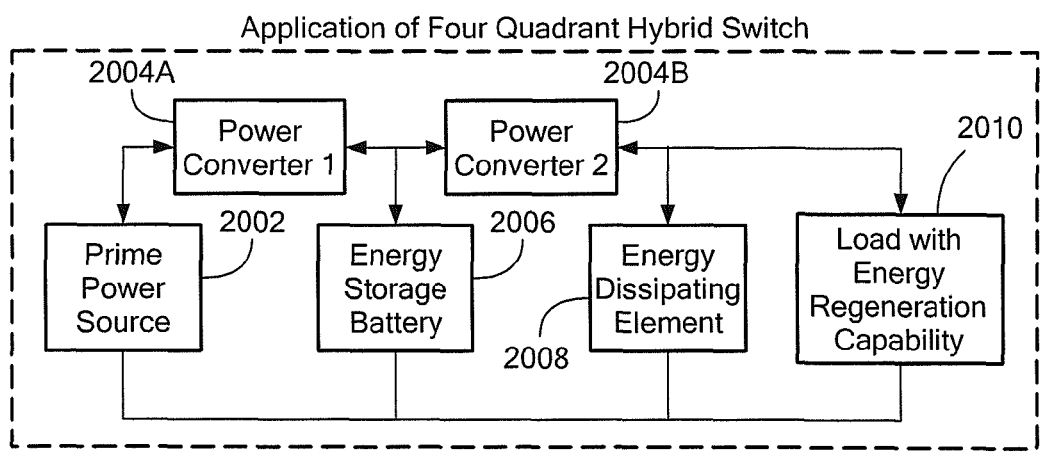
FIG. 13 is a block diagram of a power system for energy regenerative load utilizing the four quadrant hybrid switch of FIG. 12, in accordance with one embodiment of the invention.

The following are some illustrative embodiments of the invention that include devices and systems that can use the hybrid switch 10 of FIGS. 3A-3B, as operated in connection with the methods of FIGS. 4-8 and 11. For example, FIG. 12 is a block diagram of a four-quadrant hybrid switch 1000 with adaptive gate control, in accordance with one embodiment of the invention, and FIG. 13 is a block diagram of a power system 2000 for energy regenerative load utilizing the four quadrant hybrid switch of FIG. 12, in accordance with one embodiment of the invention. The power system 2000 of FIG. 13 includes a prime power source 2002, a first power converter (power converter 1) 2004A with bidirectional current capability, an energy storage battery 2006, a second power converter (power converter 2) 2004B with bidirectional current capability, an energy-dissipating element 2008 (e.g. a resistor) and a load 2010 capable of regenerating energy. The power converter 1 2004A interfaces the prime power source 2002 to the system. The energy storage battery 2006 provides a backup source when the prime power source 2002 is down and stores energy returned to the system 2000 by the load 2010. The power converter 2 2004B interfaces the load 2010 to the system 2000. The energy dissipating element 2008 absorbs regenerated energy that cannot be returned to the system 2000.

Figure 14:
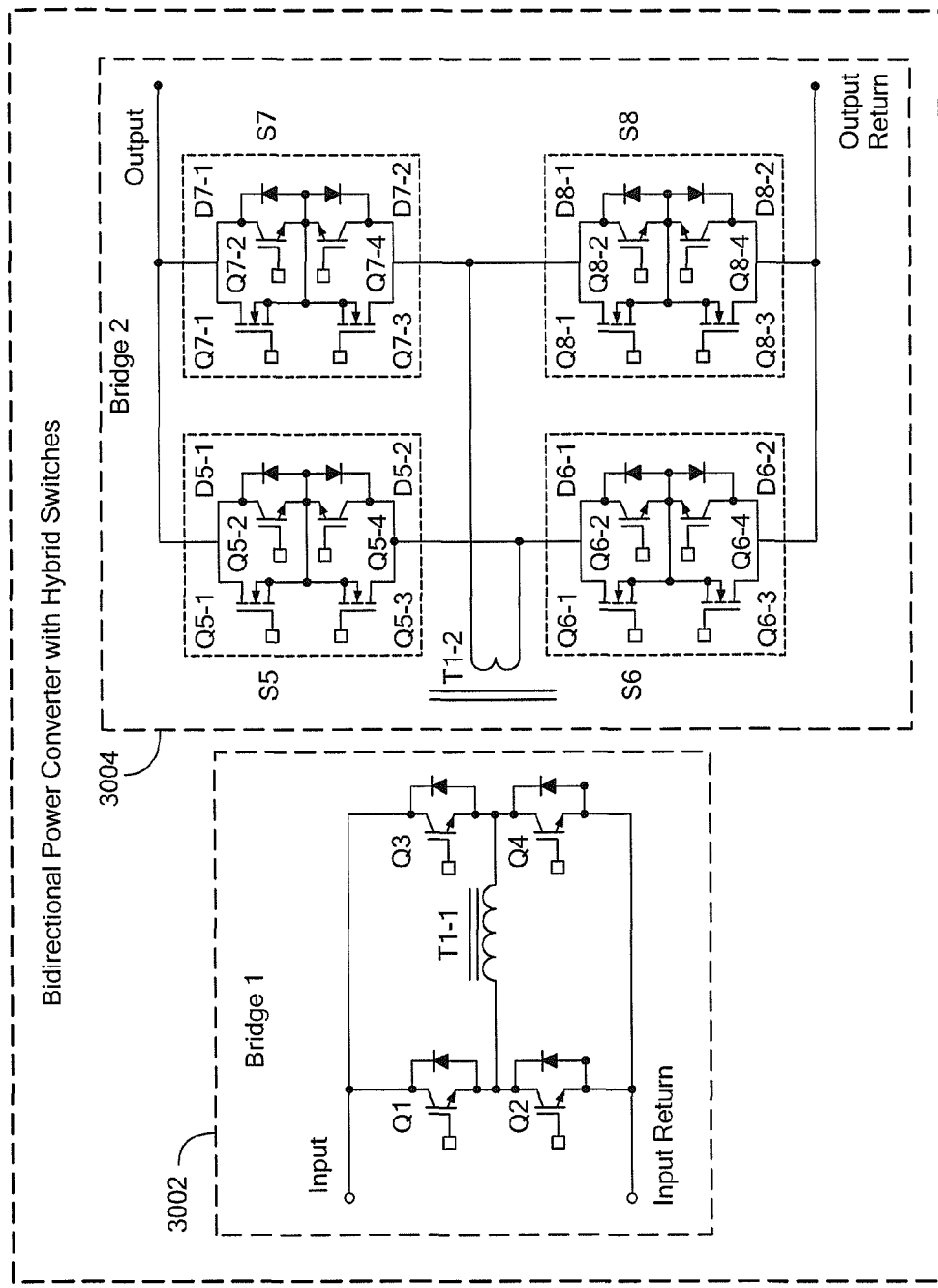
FIG. 14 is a block diagram of a bidirectional power converter with hybrid switches, which uses the four quadrant hybrid switch of FIG. 12 and can be used in the system of FIG. 13.

FIG. 14 is a block diagram of a bidirectional power converter with hybrid switches 2004B, which is implemented using the four-quadrant hybrid switch with adaptive gate control 1000 of FIG. 12. The bidirectional power converter 2004B of FIG. 14 corresponds to Power Converter 2 2004B of FIG. 13, where this implementation includes a Dual Active Bridge using hybrid switches S5-S8 in bridge 2 2004.

Referring to FIGS. 12-14, in the forward power transfer mode, the converter 2004B takes power from the primary source 2002 and the battery 2006 and delivers it to the load 2010. In the reverse power transfer mode, the power converter 2 2004B recharges the battery 2006 using energy regenerated by the load 2010. Considering the hybrid switch S5 in the forward power transfer mode as an example (this hybrid switch S5 is similar to the four-quadrant hybrid switch 1000 of FIG. 12), its components Q5-1 and Q5-2 are turned off while components Q5-3, Q5-4 and diodes D5-1 and D5-2 are active. In the reverse power transfer, components Q5-3 and Q5-4 are turned off while components Q5-1, Q5-2 and diodes D1 and D2 are active. The remaining switches S6-S8 of the power converter 2004B conduct in the same manner in both forward and reverse power transfer modes.

To understand the flexibility and improved system-level reliability afforded by the hybrid switch 10 of this embodiment of the invention, consider the following example. If the controller (e.g., controller 21 of FIG. 3A) of the switch 5 detects an impending failure of component Q5-2 (an IGBT) under reverse power transfer, the controller 21 shuts down component Q5-2 (the IGBT) and continues operation with the remaining component Q5-1 (MOSFET), in a manner similar to that described in connection with the aforementioned methods of FIGS. 4-8 and 11 and the related FIGS. 9 and 10. Because the MOSFET's power processing capability is limited, the power converter 2 2004B allows only a fraction of the full power to be returned from the load 2010 to the battery 2006. If the rate of energy return is low, the converter 2004B continues operation with one impaired switch until all energy is returned to the battery. If the energy recovery rate is high, the remaining power may cause an overvoltage at the load terminals. In this case, the energy dissipating element 2008 (e.g., a resistor, such as an air or water cooled device of a size sufficient, based on the application, to dissipate the energy, shall be activated to absorb the energy that could not be regenerated. Notably, during the transition time interval required to turn on the energy dissipating element, the MOSFET Q5-1 has to operate at the maximum SOA to reduce overvoltage at the load terminals (i.e., in accordance with the methods of FIGS. 4-8 and 11).

One or more embodiments of the invention could be adapted to work in many different types of power systems, including but not limited to the aforementioned '301 patent, as well as in U.S. Pat. No. 8,072,093, "Intelligent Power System, issued Dec. 6, 2011 inventors Boris S. Jacobson et al., which is hereby incorporated by reference in its entirety.

As the above description and associated Figures show, the invention provides systems, methods, and devices for power systems that provide reliability enhancement, transition intervals control (including adaptive closed-loop control of transition time intervals) varying conduction patterns to shift load to a single device while keeping other device off for a short timer interval, self-diagnosis of faults, prediction of potential faults, calibration of installed devices/systems and dynamic self-adjustment of operating parameters, all of which take into account actual operating conditions. At least some embodiments of the invention provide the ability to determine if anything is wrong with power devices that appear to be working. In addition, at least some embodiments of the invention provide methods of inspecting and calibrating installed transistors according to their power handling capability.

In the Figures of this application, in some instances, a plurality of system elements or method blocks may be shown as illustrative of a particular system element, and a single system element or method block may be shown as illustrative of a plurality of a particular systems elements or method blocks. It should be understood that showing a plurality of a particular element or block is not intended to imply that a system or method implemented in accordance with the invention must comprise more than one of that element or block, nor is it intended by illustrating a single element or block that the invention is limited to embodiments having only a single one of that respective elements or blocks. In addition, the total number of elements or blocks shown for a particular system element or method is not intended to be limiting; those skilled in the art can recognize that the number of a particular system element or method blocks can, in some instances, be selected to accommodate the particular user needs.

Also in the Figures, for drawings, flow charts, and/or flow diagrams illustrating methods or processes, rectangular blocks are "processing blocks" that can represent one or more instructions (or groups of instructions), such as computer software instructions. The diamond shaped blocks are "decision blocks," that one or more instructions (or groups of instructions), such as computer software instructions, that affect the execution of the computer software instructions represented by the processing blocks. Alternatively, the processing and decision blocks represent actions performed by functionally equivalent circuits such as a digital signal processor circuit, a microcontroller, or an application specific integrated circuit (ASIC). Further, actions and blocks can be implemented using combinations of hardware and software.

The drawings, flow charts, block diagrams, and flow diagrams do not depict the syntax of any particular programming language. Rather, the drawings, flow charts, block diagrams, and flow diagrams flow illustrate the functional information one of ordinary skill in the art requires to fabricate circuits and/or to generate computer software to perform the processing required in accordance with the present invention. Note that many routine program elements, such as initialization of loops and variables and the use of temporary variables are not shown. It will be appreciated by those of ordinary skill in the art that unless otherwise indicated herein, the particular sequence of steps described is illustrative only and can be varied without departing from the spirit of the invention. Thus, unless otherwise stated the steps described herein are unordered meaning that, when possible, the steps can be performed in any convenient or desirable order.

Additionally, the software used to implement all or part of the invention may be embodied in a computer program product that includes a computer useable medium. For example, such a computer usable medium can include a readable memory device, such as a hard drive device, a CD-ROM, a DVD-ROM, or a computer diskette, having computer readable program code segments stored thereon. The computer readable medium can also include a communications link, either optical, wired, or wireless, having program code segments carried thereon as digital or analog signals.

In describing the embodiments of the invention illustrated in the figures, specific terminology (e.g., language, phrases, product brands names, etc.) is used for the sake of clarity. These names are provided by way of example only and are not limiting. The invention is not limited to the specific terminology so selected, and each specific term at least includes all grammatical, literal, scientific, technical, and functional equivalents, as well as anything else that operates in a similar manner to accomplish a similar purpose. Furthermore, in the illustrations, Figures, and text, specific names may be given to specific features, elements, circuits, modules, tables, software modules, systems, etc. Such terminology used herein, however, is for the purpose of description and not limitation.

Although the invention has been described and pictured in a preferred form with a certain degree of particularity, it is understood that the present disclosure of the preferred form, has been made only by way of example, and that numerous changes in the details of construction and combination and arrangement of parts may be made without departing from the spirit and scope of the invention.

Having described and illustrated the principles of the technology with reference to specific implementations, it will be recognized that the technology can be implemented in many other, different, forms, and in many different environments. The technology disclosed herein can be used in combination with other technologies. Accordingly, it is submitted that that the invention should not be limited to the described embodiments but rather should be limited only by the spirit and scope of the appended claims. In addition, all publications and references cited herein are expressly incorporated herein by reference in their entirety.

The invention claimed is:

1. A method of controlling a hybrid switch, the method comprising:
    providing a controllable hybrid switch comprising a first semiconductor switch operably coupled in parallel to a second semiconductor switch, each respective semiconductor switch being individually controllable and having a respective switching speed and a respective power-processing capability, wherein the first semiconductor switch has a faster switching speed than that of the second semiconductor switch and wherein the second semiconductor switch has a higher power-processing capability than that of the first semiconductor switch;
    accessing first device data for the controllable hybrid switch, the device data comprising a first reference value $V_{1REF}$ for a first default turn-on transition time interval $\Delta T_1$ and a second reference value $V_{2REF}$ for a second default turn-off transition time interval $\Delta T_2$;
    enabling the controllable hybrid switch and controlling the operation of the controllable hybrid switch so that it operates in accordance with the first device data; and
    dynamically adjusting the duration of the default $\Delta T_1$ and $\Delta T_2$ used to control operation of the controllable hybrid switch, so as to compensate for at least one of variations in a current to a load operably coupled to the controllable hybrid switch and environmental conditions at the controllable hybrid switch.

2. The method of claim 1, wherein dynamic adjustment of the default $\Delta T_1$ and $\Delta T_2$ so as to compensate for variations in current to a load further comprises:
    monitoring a voltage across the controllable hybrid switch and a current through the second semiconductor device;
    if the voltage sensed across the controllable hybrid switch is less than $V_{1REF}$, adjusting $\Delta T_1$ so as to turn on the second semiconductor switch; and
    if the current sensed through the second semiconductor device is less than $V_{2REF}$, adjusting $\Delta T_2$ so as to turn off the first semiconductor switch.

3. The method of claim 2, wherein the monitoring of voltage and current occurs at least one of continuously and substantially periodically.

4. The method of claim 1, wherein compensating for environmental conditions further comprises:
    monitoring a first operating temperature at the first semiconductor switch and a second operating temperature at the second semiconductor switch; and
    dynamically adjusting at least one of the default values $V_{1REF}$ and $V_{2REF}$ used to control operation of the controllable hybrid switch, the dynamic adjustment based at least in part on at least one of the monitored first operating temperature, the monitored second operating temperature, and the monitored first current through the second semiconductor switch, wherein the adjustment of the at least one of the default values $V_{1REF}$ and $V_{2REF}$ effectively also dynamically adjusts at least one of the default $\Delta T_1$ and the default $\Delta T_2$.

5. The method of claim 4, further comprising:
    accessing second device data for the controllable hybrid switch, the second device data comprising: a first nominal junction temperature $T_{J1NOM}$ for the first semiconductor switch and a first nominal power threshold $P_{1NOM}$ for the first semiconductor switch;
    controlling the operation of the controllable hybrid switch so that it operates in accordance with the both the first device data and the second device data;
    monitoring junction temperature $T_{J1}$ and measured power $P_{M1}$ of the first semiconductor switch;
    if $T_{J1}$ is greater than $T_{1NOM}$ or if $P_{M1}$ is greater than or equal to $P_{1NOM}$, then dynamically inserting a time delay to at least one of $V_{1REF}$ and $V_{2REF}$ used to control operation of the controllable hybrid switch, wherein the time delay comprises a period of time sufficient to settle at least one of the junction temperatures of the first semiconductor switch and the second semiconductor switch.

6. The method of claim 4, further comprising:
    accessing third device data for the controllable hybrid switch, the third device data comprising: a second nominal junction temperature $TJ_{2NOM}$ for the second semiconductor switch; and a second nominal power threshold $P_{2NOM}$ for the second semiconductor switch;
    controlling the operation of the controllable hybrid switch so that it operates in accordance with the both the first device data and the third device data;

monitoring junction temperature $T_{J2}$ and measured power $P_{M2}$ of the second semiconductor switch;

monitoring junction temperature $T_{J2}$ and measured power $P_{M2}$ of the second semiconductor switch; and if $T_{J2} \geq T_{2NOM}$ or if $P_{M2} \geq P_{2NOM}$, then providing a notification to report the difference.

7. The method of claim 6, wherein the notification is provided to a control system in operable communication with the controllable hybrid switch, the control system constructed and arranged to control operation of the controllable hybrid switch.

8. The method of claim 1, further comprising:

accessing device data for the controllable hybrid switch, the device data comprising: a first nominal junction temperature $T_{J1NOM}$ for the first semiconductor switch; a first nominal power threshold $P_{1NOM}$ for the first semiconductor switch; a second nominal junction temperature $TJ_{2NOM}$ for the second semiconductor switch; and a second nominal power threshold $P_{2NOM}$ for the second semiconductor switch;

enabling the controllable hybrid switch and controlling the operation of the controllable hybrid switch so that it operates in accordance with its device data;

monitoring a first operating temperature at the first semiconductor switch and a second operating temperature at the second semiconductor switch;

monitoring junction temperature $T_{J1}$ and measured power $P_{M1}$ of the first semiconductor switch and junction temperature $T_{J2}$ and measured power $P_{M2}$ of the second semiconductor switch;

dynamically adjusting at least one of the default values $V_{1REF}$ and $V_{2REF}$ used to control operation of the controllable hybrid switch, the dynamic adjustment based at least in part on at least one of the monitored first operating temperature, the monitored second operating temperature, and the monitored first current through the second semiconductor switch, wherein the adjustment of the at least one of the default values $V_{1REF}$ and $V_{2REF}$ effectively also dynamically adjusts at least one of the default $\Delta T_1$ and the default $\Delta T_2$ used to control the controllable hybrid switch;

if $T_{J1}$ is greater than $T_{1NOM}$ or if $P_{M1}$ is greater than or equal to $P_{1NOM}$, then dynamically inserting a time delay to at least one of $V_{1REF}$ and $V_{2REF}$, used to control operation of the controllable hybrid switch, wherein the time delay comprises a period of time sufficient to settle at least one of the junction temperatures of the first semiconductor switch and the second semiconductor switch; and if $T_{J2} \geq T_{2NOM}$ or if $P_{M2} \geq P_{2NOM}$, then providing a notification to report the difference.

9. The method of claim 1, wherein the first and second controllable semiconductor switches comprise one of the following pairings:

the first controllable semiconductor switch comprises a controllable metal oxide semiconductor field effect transistor (MOSFET) and the second controllable semiconductor switch comprises a controllable insulated gate bipolar transistor (IGBT); or the first controllable semiconductor switch comprises a controllable IGBT and the second controllable semiconductor switch comprises a controllable thyristor.

10. A method for controlling the operation of a hybrid switch, the method comprising:

providing a controllable hybrid switch, the controllable hybrid switch comprising a first semiconductor switch operably coupled in parallel to a second semiconductor switch, each semiconductor switch being individually controllable and having a respective switching speed and a respective power-processing capability, wherein the first semiconductor switch has a faster switching speed than that of the second semiconductor switch and wherein the second semiconductor switch has a higher power-processing capability than that of the first semiconductor switch;

enabling the hybrid switch;

dynamically receiving data indicating operating condition information for at least one of the controllable hybrid switch, the first semiconductor switch, and the second semiconductor switch;

if the operating condition information indicates imminent failure of at least one of the first semiconductor switch, and the second semiconductor switch, then:

turning off the respective first or second semiconductor switch whose operating condition indicates the imminent failure; and dynamically controlling operation of the controllable hybrid switch by controlling operation of the other of the first and second semiconductor switches to be in at least one of three operating modes: operating for a limited time, operating at reduced power, or operating for both a limited time and at reduced power.

11. The method of claim 10, further comprising:

if the controllable hybrid switch is operated for either a limited time or for a limited time at reduced power, shutting down the controllable hybrid switch when the limited time is expired.

12. The method of claim 11, further comprising sending a notification when the controllable hybrid switch is shut down.

13. The method of claim 10, further comprising:

if the operating condition information indicates that either the first or second semiconductor switch is in a condition of imminent failure, determining whether power to the respective first or second semiconductor switch that is not in the condition of imminent failure, can be reduced;

if the power to the respective first or second semiconductor switch that is not in condition of imminent failure cannot be reduced, then:

shutting down the respective first or second semiconductor switch in the condition of imminent failure;

determining time to shutdown of the controllable hybrid switch;

providing a first notification related to a time to shutdown of the controllable hybrid switch; and shutting down the controllable hybrid switch after the time to shutdown has expired.

14. The method of claim 10, wherein, if power to the respective first or second semiconductor switch that is not in the condition of imminent failure can be reduced, then the method further comprises:

shutting down the respective first or second semiconductor switch in the condition of imminent failure;

dynamically controlling operation of the other first or second semiconductor switch not in the condition of imminent failure such that it operates at a reduced power;

shutting down, after a first predetermined time, the first or second semiconductor switch that that is operating at reduced power; and shutting down the controllable hybrid switch after shutting down the first or second semiconductor switch that is operating at reduced power.

15. The method of claim 10, wherein, if the operating condition information indicates imminent failure of at least one of the first semiconductor switch and the second semiconductor switch, the method further comprises:

accessing device data associated with the other of the respective first or second semiconductor switch, where the other respective first or second semiconductor switch is not in imminent failure, the device data comprising at least one of a default drain to source voltage ($V_{DS}$) boundary, a default power boundary (PB), a default RMS current boundary ($I_{DRMS}$), a default $R_{DS(on)}$ limited current boundary, Switching Safe Operating Area (SSOA), breakdown collector to emitter voltage boundary $V_{CES}$ and pulsed collector current $I_{CM}$;

computing, for each respective junction temperature of the first or second semiconductor switch not in imminent failure, in a predetermined range of temperatures, a set of boundaries, each respective boundary based on the device data for the respective first or second semiconductor switch and on a predetermined reliability characteristic as a function of drain current $I_D$ and drain to source voltage $V_{DS}$ for the respective first or second semiconductor switch, wherein each respective boundary defines a respective SOA;

monitoring, for the respective first or second semiconductor switch not in imminent failure, a junction temperature of the respective first or second semiconductor switch;

selecting an SOA based on the predetermined reliability characteristic that is desired; and dynamically controlling operation of the respective first or second semiconductor switch in accordance with the respective boundary associated with the selected SOA and predetermined reliability characteristic that is desired.

16. The method of claim 10, further comprising:
determining an operating condition for at least one of the controllable hybrid switch, the first semiconductor switch, and the second semiconductor switch, the determining comprising:
monitoring an operating parameter of at least one of the controllable hybrid switch, the first semiconductor switch, and the second semiconductor switch;
accessing device data for the at least one of the controllable hybrid switch, the first semiconductor switch, and the second semiconductor switch that is being monitored;
determining a predicted value of the operating parameter based on the device data; and
comparing the predicted value of the operating parameter with the monitored operating parameter to determine whether a predetermined operating condition exists for the at least one of the controllable hybrid switch, the first semiconductor switch, and the second semiconductor switch, the predetermined operating condition indicating that the respective at least one of the controllable hybrid switch, the first semiconductor switch, and the second semiconductor switch is in danger of imminent failure.

17. The method of claim 16, wherein the predetermined operating condition comprises at least one of over-temperature, current tunneling, excessive power, over-current, over-voltage, a coolant problem, a heat sink problem, a die defect, a die bonding defect, a die attachment defect, a device package mounting defect, and an environmental condition.

18. A controllable hybrid switch, comprising:
a first semiconductor switch, the first semiconductor switch being controllable and having a first switching speed and a first power-processing capability;
a second semiconductor switch operably coupled in parallel to the first semiconductor switch, the second semiconductor switch being controllable and having a second switching speed that is slower than the first switching speed and a second power-processing capability that is larger than the first power-processing capability;
a first set of sensors sensing a first set of operating parameters for the first semiconductor switch, the first set of operating parameters including at least a first junction temperature, a first voltage across the first semiconductor switch, and a first current through the first semiconductor switch; and
a second set of sensors sensing a second set of operating parameters for the second semiconductor switch, the second set of operating parameters including at least a second junction temperature, a second voltage across the second semiconductor switch, and a second current through the second semiconductor switch; and
wherein the first and second semiconductor switches and first and second sets of sensors are constructed and arranged to be in operable communication with a controller, wherein the controller is programmed to:
access first device data for the controllable hybrid switch, the device data comprising a first reference value $V_{1REF}$ for a first default turn-on transition time interval $\Delta T_1$ and a second reference value $V_{2REF}$ for a second default turn-off transition time interval $\Delta T_2$;
enable the controllable hybrid switch and control the operation of the controllable hybrid switch so that it operates in accordance with the first device data; and
dynamically adjust the duration of the default $\Delta T_1$ and $\Delta T_2$ used to control operation of the controllable hybrid switch, so as to compensate for at least one of variations in a current to a load operably coupled to the controllable hybrid switch and environmental conditions at the controllable hybrid switch.

19. The controllable hybrid switch of claim 18, wherein the controller is further programmed to:
dynamically receive data indicating operating condition information for at least one of the controllable hybrid switch, the first semiconductor switch, and the second semiconductor switch; and
if the operating condition information indicates imminent failure of at least one of the first semiconductor switch, and the second semiconductor switch, then:
turn off the respective first or second semiconductor switch whose operating condition indicates the imminent failure; and
dynamically control operation of the controllable hybrid switch by controlling operation of the other of the first and second semiconductor switches to be in at least one of three operating modes: operating for a limited time, operating at reduced power, or operating for both a limited time and at reduced power.

20. The controllable hybrid switch of claim 18, wherein the first and second controllable semiconductor switches comprise one of the following pairings:
the first controllable semiconductor switch comprises a controllable metal oxide semiconductor field effect transistor (MOSFET) and the second controllable semiconductor switch comprises a controllable insulated gate bipolar transistor (IGBT); or
the first controllable semiconductor switch comprises a controllable IGBT and the second controllable semiconductor switch comprises a controllable thyristor.

* * * * *